US007358885B2

(12) United States Patent
Maxim et al.

(10) Patent No.: US 7,358,885 B2
(45) Date of Patent: Apr. 15, 2008

(54) MIXING DAC ARCHITECTURES FOR A RADIO FREQUENCY RECEIVER

(75) Inventors: Adrian Maxim, Austin, TX (US); Richard A. Johnson, Buda, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 11/565,492

(22) Filed: Nov. 30, 2006

(65) Prior Publication Data
US 2007/0085719 A1   Apr. 19, 2007

Related U.S. Application Data

(63) Continuation-in-part of application No. 10/784,838, filed on Feb. 23, 2004, which is a continuation-in-part of application No. 10/375,967, filed on Feb. 28, 2003, now Pat. No. 6,778,117, which is a continuation-in-part of application No. 10/377,573, filed on Feb. 28, 2003.

(51) Int. Cl.
    *H03M 1/66* (2006.01)
(52) U.S. Cl. .................. 341/144; 341/136; 341/143; 375/316
(58) Field of Classification Search .......... 341/144
    See application file for complete search history.

(56) References Cited

U.S. PATENT DOCUMENTS 4,346,477 A    8/1982   Gordy
4,464,770 A    8/1984   Maurer et al.
4,626,803 A   12/1986   Holm
4,653,117 A    3/1987   Heck
4,803,700 A    2/1989   Dewey et al.
4,817,167 A    3/1989   Gassmann (Continued)

FOREIGN PATENT DOCUMENTS

WO         WO 87/01531      3/1987

OTHER PUBLICATIONS

"A GSM/GPRS Mixed Signal Baseband IC," Redmond, David. et al., IEEE Int'l, Solid State Circuits Conference (ISSCC), Digest of Technical Papers, XP010585465, Feb. 2002, Sec. 3.6, 3 pages.

(Continued)

*Primary Examiner*—Khai M. Nguyen
(74) *Attorney, Agent, or Firm*—Larson Newman Abel Polansky & White, LLP

(57) ABSTRACT

A receiver (300) includes a mixing digital-to-analog converter (DAC) (118A), a direct digital frequency synthesizer (DDFS) (132) and a dynamic element matching (DEM) circuit (304). A DAC of the mixing DAC (118A) is implemented as a segmented DAC having a thermometer encoded DAC section (120A) and a binary encoded DAC section (120B). The DDFS (132) includes outputs configured to provide bits associated with a digital LO signal to inputs of a switching section (124A, 124B) of the mixing DAC (118A). The DEM circuit (304) is coupled between the outputs of the DDFS (132) and the inputs of the switching section (124A) that are associated with the thermometer encoded DAC section (120A). The DEM circuit (304) is configured to scramble the bits provided to the thermometer encoded DAC section (120A).

20 Claims, 16 Drawing Sheets

U.S. PATENT DOCUMENTS

| | | |
|---|---|---|
| 4,926,130 A | 5/1990 | Weaver |
| 4,944,025 A | 7/1990 | Gehring |
| 4,975,699 A | 12/1990 | Frey |
| 5,251,218 A | 10/1993 | Stone et al. |
| 5,263,194 A | 11/1993 | Ragan |
| 5,440,587 A | 8/1995 | Ishikawa et al. |
| 5,544,200 A | 8/1996 | An |
| 5,640,698 A | 6/1997 | Shen et al. |
| 5,826,180 A | 10/1998 | Golan |
| 5,828,955 A | 10/1998 | Lipowski |
| 5,867,535 A | 2/1999 | Phillips et al. |
| 6,154,640 A | 11/2000 | Itoh et al. |
| 6,249,179 B1 | 6/2001 | Maalej et al. |
| 6,278,391 B1* | 8/2001 | Walker ................... 341/118 |
| 6,330,290 B1 | 12/2001 | Glas |
| 6,639,534 B2* | 10/2003 | Khoini-Poorfard et al. . 341/144 |
| 6,785,529 B2 | 8/2004 | Ciccarelli et al. |
| 6,829,311 B1 | 12/2004 | Riley |
| 6,867,693 B1 | 3/2005 | Radin |
| 6,950,047 B1* | 9/2005 | Piasecki et al. ............ 341/131 |
| 6,963,734 B2 | 11/2005 | Sorrells et al. |
| 7,183,958 B2* | 2/2007 | Quilligan et al. ........... 341/144 |
| 7,199,740 B1* | 4/2007 | Ferguson, Jr. et al. ...... 341/144 |
| 7,227,438 B2* | 6/2007 | Song et al. ................. 335/216 |
| 2003/0112893 A1* | 6/2003 | Lee et al. ................... 375/302 |
| 2003/0223525 A1 | 12/2003 | Momtaz et al. |
| 2004/0002318 A1 | 1/2004 | Kerth et al. |
| 2004/0169773 A1* | 9/2004 | Johnson ..................... 348/731 |
| 2005/0117071 A1* | 6/2005 | Johnson ..................... 348/729 |
| 2005/0239499 A1 | 10/2005 | Oosawa et al. |
| 2005/0266818 A1* | 12/2005 | Johnson et al. ............. 455/260 |
| 2006/0073800 A1* | 4/2006 | Johnson et al. .......... 455/182.3 |
| 2006/0083320 A1* | 4/2006 | Feher ........................ 375/259 |

OTHER PUBLICATIONS

"Optimized Digital Singal Processing for Flexible Receivers," Brückmann, Dieter et al., IEEE Int'l (ICASSP), XP010804418, 2002, pp. IV—3765-3766.

* cited by examiner

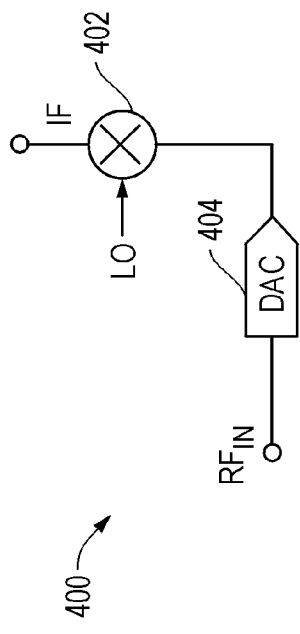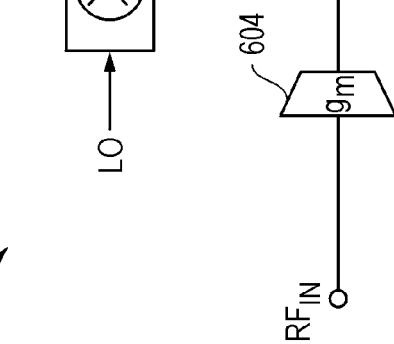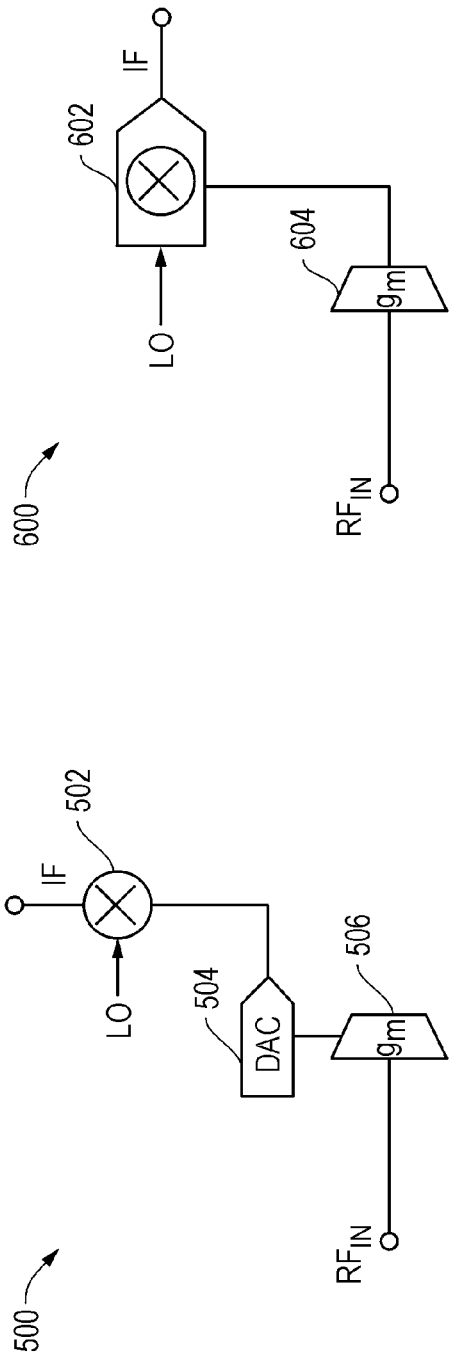

MIXING DAC ARCHITECTURES FOR A RADIO FREQUENCY RECEIVER

This application is a continuation-in-part of U.S. patent application Ser. No. 10/784,838 (filed Feb. 23, 2004), which is a continuation-in-part of U.S. patent application Ser. No. 10/375,967 (filed Feb. 28, 2003 and now U.S. Pat. No. 6,778,117) and U.S. patent application Ser. No. 10/377,573 (filed Feb. 28, 2003), the disclosures of which are all hereby incorporated herein by reference in their entirety for all purposes.

CROSS-REFERENCE TO RELATED APPLICATION(S)

This application is related to U.S. patent application Ser. No. 11/565,487, entitled "INTERFACE/SYNCHRONIZATION CIRCUITS FOR RADIO FREQUENCY RECEIVERS WITH MIXING DAC ARCHITECTURES," by Adrian Maxim, Charles Thompson and Mitchell Reid, filed on Nov. 30, 2006 and assigned to the assignee hereof.

TECHNICAL FIELD

The present invention is generally directed to a radio frequency (RF) receiver and, more particularly, to mixing digital-to-analog converter (DAC) architectures for an RF receiver.

BACKGROUND

As is known, broadcast TV uses a frequency spectrum of about 40 MHz to about 900 MHz, depending on the country and standard. In a usual case, the spectrum may be populated with both weak and strong channels, depending on a location of a given receiver with respect to a particular transmitter. In a typical case, a mixers of a receiver down-converts both a desired channel and an image channel. The image channel is situated on an opposite side of a local oscillator (LO) frequency at two times the intermediate frequency (IF) away from the desired channel. The image channel, when provided by a transmitter located near a receiver, may have a relatively high power, when compared to the power of a desired channel provided by a transmitter located at greater distance from the receiver. Even when the gain of the down-converted image channel is reduced through specific techniques (e.g., bandpass filtering around the desired channel), it can be difficult to achieve a desired attenuation of the image channel. As an image channel resides on top of the desired channel when down-converted, the image channel can significantly degrade the reception quality of a receiver.

A number of techniques have been utilized in receivers to address the image channel issue. One technique has employed an up-converting/down-converting architecture to address the image channel issue. In this case, an up-conversion mixer translates a desired channel to a relatively high first intermediate frequency (IF) value (e.g., 1.2 to 1.6 GHZ) to provide a relatively large 2IF distance between the desired channel and an image channel. The translated signal has then been filtered with an off-chip filter, e.g., a surface acoustic wave (SAW) or LC filter, to remove consideration of image issues in a down-converting mixer, which may convert the translated signal to standard IF, low IF or baseband. Unfortunately, up-converting/down-converting architectures are relatively expensive to implement, due to, at least in part, the off-chip filter. Moreover, such architectures have a relatively high power dissipation, due to the large number of sections operating at high frequency (typically 1 GHz or more). Additionally, up-converting/down-converting architectures have required high-speed devices, such as advanced bipolar complementary metal-oxide semiconductor (BiCMOS) or deep-submicron (e.g., less than 0.13 micron) CMOS processes, which are relatively expensive.

Another technique that has been used to address the image channel issue has employed complex (quadrature) mixers, in conjunction with off-chip front-end tracking filters. Such architectures have relatively low IF values (e g., 30 to 60 MHz) for standard IF and even lower IF values (e.g., a 1 to 6 MHz) for low IF receivers. The relatively low desired channel to image channel separation (e.g., 60 to 120 MHz for standard IF and 2 to 12 MHz for low IF receivers) requires the implementation of a relatively high-order variable front-end tracking filter to ensure satisfactory rejection of the image channel. High-order tracking filters may require a relatively large number of discrete inductors, varactors and fixed capacitors which has increased a required footprint of the receiver printed circuit board (PCB). Furthermore, the components (e.g., inductors, varactors and fixed capacitors) of a high-order tracking filter must generally be manually aligned to reduce the impact of device process variations and to facilitate proper tracking of a desired channel. Unfortunately, high-order tracking filters are relatively expensive and are not readily integrated on-chip.

Open-loop gain and phase calibration or correction has also been used to address image channel issues for complex mixers of receivers. However, when analog correction circuitry is implemented, the low accuracy of the analog correction circuitry tends to limit an image rejection performance of a received. Furthermore, an analog correction circuit typically requires calibration or re-calibration to account for process, temperature and/or supply voltage variations. Additionally, analog implementations are usually not well suited for modern high integrated solutions that use digital signal processing and digital control. While digital control of loop gain and phase calibration or correction has been employed, implementing digital control has required converting the intermediate frequency (IF) in-phase IF(I) and IF quadrature IF(Q) signals to a digital format. In the terrestrial TV case, a relatively large analog-to-digital converter (ADC) dynamic range is required. Unfortunately, ADCs with large dynamic ranges are difficult to integrate in general purpose complementary metal-oxide semiconductor (CMOS) technology.

What is needed is a technique for improving image rejection of a receiver that may be readily implemented in an integrated circuit using available CMOS processes.

SUMMARY

According to one aspect of the present invention, a receiver includes a mixing digital-to-analog converter (DAC), a direct digital frequency synthesizer (DDFS) and a dynamic element matching (DEM) circuit. The mixing DAC includes a radio frequency (RF) transconductance section and a switching section. The RF transconductance section includes an input for receiving an RF signal and an output for providing an RF current signal. The switching section is coupled to the RF transconductance section and includes inputs for receiving bits associated with a digital local oscillator (LO) signal and an output configured to provide an analog output signal. A DAC of the mixing DAC is implemented as a segmented DAC having a thermometer encoded DAC section and a binary encoded DAC section. The DDFS includes outputs configured to provide the bits associated with the LO signal to the inputs of the switching section. The DEM circuit is coupled between the outputs of the DDFS and the inputs of the switching section that are associated with the thermometer encoded DAC section and is configured to scramble the bits provided to the thermometer encoded DAC section.

According to another aspect of the present invention, a receiver includes a mixing digital-to-analog converter (DAC), a direct digital frequency synthesizer (DDFS) and a DC current source. The mixing DAC includes an RF transconductance section and a switching section. The RF transconductance section includes an input for receiving a radio frequency (RF) signal and an output for providing an RF current signal. The switching section is coupled to the RF transconductance section and includes inputs for receiving bits associated with a local oscillator (LO) signal and an output configured to provide an analog output signal. The DDFS includes outputs configured to provide the bits associated with the LO signal to the inputs of the switching section. The DC current source is configured to substantially direct bias currents from flowing through a load coupled to the output of the switching section.

According to another embodiment, a receiver includes a mixing digital-to-analog converter (DAC) and a direct digital frequency synthesizer (DDFS). The mixing DAC includes a radio frequency (RF) transconductance section, a switching section and a transconductance boosting section. The RF transconductance section includes an input for receiving an RF signal and an output for providing an RF current signal. The switching section is coupled to the RF transconductance section and includes inputs for receiving bits associated with a digital local oscillator (LO) signal and an output configured to provide an analog output signal at the output of the switching section. The transconductance boosting section is coupled between a load and the output of the switching section. The DDFS includes outputs configured to provide the bits associated with the LO signal to the inputs of the switching section.

BRIEF DESCRIPTION OF THE DRAWINGS

The present disclosure may be better understood, and its numerous features and advantages made apparent to those skilled in the art by referencing the accompanying drawings.

FIG. 4 is an electrical block diagram of an exemplary mixing DAC, configured according to an embodiment of the present invention;

FIG. 5 is an electrical block diagram of another mixing DAC architecture;

FIG. 6 is an electrical block diagram of yet another mixing DAC architecture;

FIG. 9-1 is an electrical schematic diagram of an alternate circuit for the output of the mixing DAC of FIG. 9, which includes an intermediate frequency (IF) transconductance section ($M_{cascIF}$) positioned between a switching section of the mixing DAC and a load of the mixing DAC, according to another embodiment of the present invention;

The use of the same reference symbols in different drawings indicates similar or identical items.

DETAILED DESCRIPTION

Figure 1:
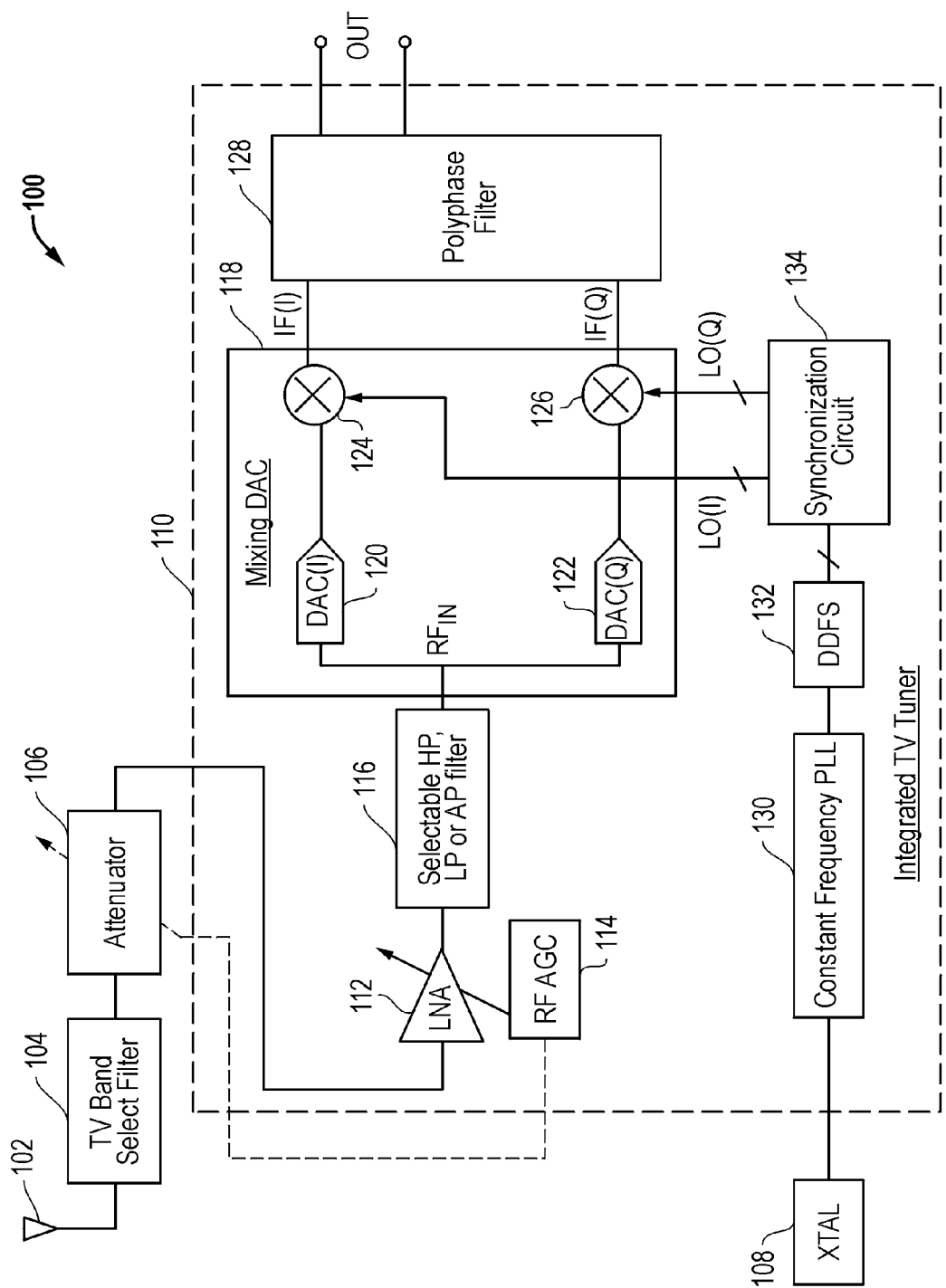
FIG. 1 is an electrical block diagram of a relevant portion of an exemplary radio frequency (RF) receiver that implements a mixing digital-to-analog converter (DAC), according to an embodiment of the present invention.
Figure 2:
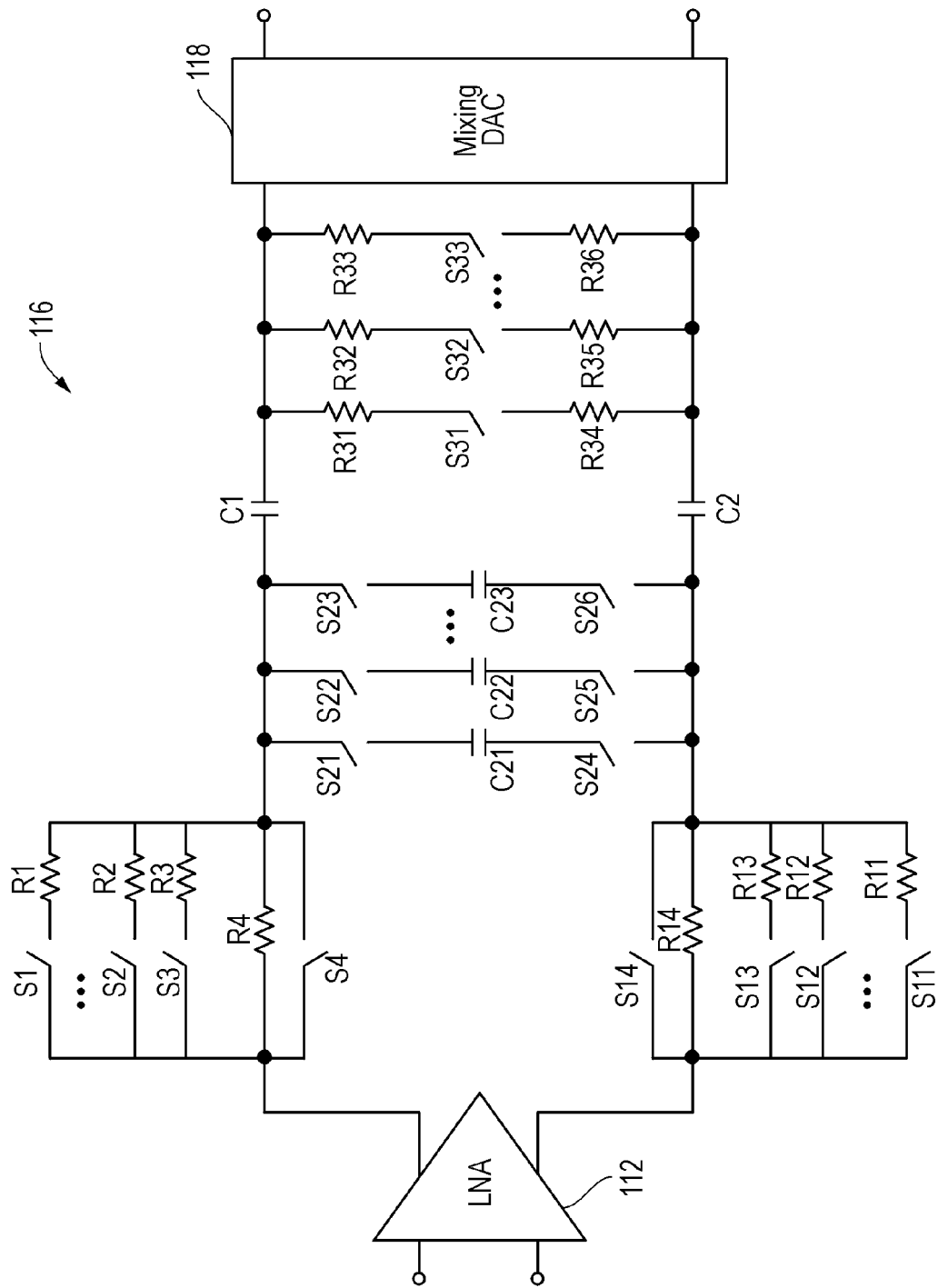
FIG. 2. is an electrical diagram, in block and schematic form, of a portion of the receiver of FIG. 1 including a low-noise amplifier (LNA), filter and mixing DAC.

Receivers that employ mixing digital-to-analog converters (DACs) in conjunction with direct digital frequency synthesizers (DDFSs) provide relatively low-cost TV receivers, due to, at least in part, the fact that off-chip tracking filters are not normally required. In a typical application, a constant frequency phase locked loop (PLL) may be used to drive the DDFS. In general, a constant frequency PLL has a relatively small area and good phase noise performance. It should, however, be appreciated that receivers that do not employ off-chip filters are generally required to implement low noise amplifiers (LNAs) and mixing DACs that have tighter linearity/matching specifications in order to achieve similar blocking/image rejection performance as receivers that do implement off-chip filters. Such features are provided by the receivers described herein.

According to various aspects of the present invention, a mixing DAC, for a broadband radio frequency (RF) receiver is designed to provide a relatively high image rejection ratio (IRR) and a relatively high harmonic rejection ratio (HER). As used herein, a "radio frequency" signal means an electrical signal conveying useful information and having a frequency from about 3 kilohertz (kHz) to thousands of gigahertz (GHz), regardless of the medium through which such signal is conveyed. Thus, an RF signal may be transmitted through air, free space, coaxial cable, fiber optic cable, etc. A mixing DAC may implement a segmented DAC architecture to improve linearity of the mixing DAC. Furthermore, the mixing DAC may be implemented in conjunction with a synchronization circuit to improve the linearity of the mixing DAC. In this case, the synchronization circuit is coupled between the DDFS and the mixing DAC. Resistive degeneration may also be employed in signal paths and/or bias stages to improve I/Q matching and, thus, increase an image rejection of the mixing DAC. A selectable filter (including selectable high-pass (HP), low-pass (LP) and all-pass (AP) filters) may be implemented to reduce mixing DAC linearity requirements and, in turn, reduce overall power requirements of the receiver. Dynamic element matching (DEM) techniques using scrambling for thermometer encoded bits may be employed to improve mixing DAC local oscillator (LO) spur performance. Moreover, when segmented DACs are implemented within a mixing DAC, binary encoded bits may be delayed to match an arrival time of scrambled thermometer encoded bits at inputs of the mixing DAC.

As an alternative to delaying the binary encoded bits, a synchronization circuit may be employed between the DDFS and the mixing DAC. The synchronization circuit may also be employed when segmented DACs are not implemented within a mixing DAC. In any case, the synchronization circuit may be implemented as a latch structure that is driven by a unique clock signal. For example, the latch structure may include master-slave latch pairs for each of the inputs of the mixing DAC. In general, a master-slave architecture offers a minimal propagation time mismatch by reducing the impact on a clock-to-output propagation time. The master latches ensure a constant and relatively large value set-up time. Thus, the bit arrival mismatch is dominated by the difference in the clock-to-output propagation time of the slave latches.

The power requirements of a master-slave latch structure may be reduced by employing relatively low-power master latches in conjunction with relatively high-power slave latches. In the master-slave implementation, the DDFS bit propagation time is primarily determined by the mismatch between the slave latches. The number of clock lines used to drive the master-slave latches may be reduced in differential structures by using the same clock to drive both the master latches and the slave latches (i.e., the lines of the clock may be swapped and used to drive the clock for the master latches).

In general, linearity of a mixing DAC depends on matching internal components of the mixing DAC. Usually, increasing the linearity of a mixing DAC results in increased power requirements An advantage of implementing a mixing DAC, i.e., bit-by-bit mixing, within a receiver is that the mixing DAC has minimal local oscillator (LO) harmonic interference. Typically, the LO harmonics are dominated by the DAC linearity and are in excess of −60 decibels (dBs) for mixing DACs with more than ten bits.

When a mixing DAC utilizes a load resistor, it is generally desirable to prevent the mixing DAC bias current from flowing through the load resistor as the bias current may create a relatively large voltage drop that reduces a voltage headroom of the mixing DAC, which, in turn, reduces the available output voltage swing and decreases an achievable gain of the mixing DAC. To reduce the bias current that flow through a load resistor, a DC current source may be connected to the mixing DAC signal path to subtract the bias current. When the switching pair thermal noise contribution is negligible, an optimum subtractor DC current source connection may be realized at an output of the switching devices. One solution to improve the matching in the IF path of the mixing DAC is to use a transconductance (gm) boosting technique that uses relatively small IF cascode transistors and an operational amplifier (OA) to boost a transconductance of an IF cascode section. Better matching can usually be achieved with a fully differential boosting architecture.

When selecting signal path components for a mixing DAC there are a number of choices. In general, N-channel field-effect transistors (NFET) devices offer the highest transition frequency ($f_T$) and, as such, the fastest switching time. A faster switching time generally results in a lower noise contribution from the switching pairs of the mixing DAC. However, NFET devices usually have a larger 1/f (or flicker) noise, as compared to P-channel field-effect transistor (PFET) devices. The flicker noise may result in larger mixer noise degradation in low-IF receiver architectures, due to RF transconductance (gm) flicker noise leakage to the output and switching pair flicker noise up-conversion to the IF frequency. In general, using modern CMOS processes, NFETs provide the highest transconductance level for a given current budget, resulting in better matching of the mixer signal path due to the higher frequency of the signal path poles, or a lower power dissipation for a given matching performance. In contrast, PFETs have a lower flicker noise but exhibit slower switching and lower transconductance which may provide lower noise performance and a lower image rejection ratio (IRR). Signal paths of a mixing DAC may be designed using a telescopic or a folded configuration. Telescopic NFET mixing DACs may be advantageously implemented in medium and high intermediate frequency (IF) (e.g., between about 30 to about 60 MHZ and greater than about 60 MHz, respectively) receivers that have sufficient power supply voltage headroom. Moreover, folded NFET RF transconductance and PFET mixer switches may be advantageously implemented in low IF (e.g., between about 1 to about 6 MHZ) receivers.

A number of techniques may be employed to ensure that a sampling point of a synchronization circuit, which provides a digital LO signal from a DDFS to inputs of a mixing DAC, is optimized. For example, a clock signal provided to a DDFS may be manually adjusted to ensure that data provided by the DDFS is aligned with a clock signal provided to the synchronization circuit. As another example, a delay locked loop (DLL) may be employed to ensure that data provided by the DDFS is aligned with a clock signal provided to the synchronization circuit. Depending on the application, a design cycle for a product may be significantly reduced by using multiple DDFS cores, in place of a single full-rate DDFS. In this case, the multiple DDFS cores provide consecutive values of a digital LO signal, to inputs of a switching section of a mixing DAC, at a fraction of a full clock rate.

Turning to the drawings, FIG. 1 depicts an exemplary receiver (tuner) 100 that is constructed according to one or more embodiments of the present invention. As is illustrated, the receiver 100 includes an antenna 102 coupled to an input of a TV band select filter 104, whose output is coupled to an input of an attenuator 106. As used herein, the term "coupled" includes both a direct electrical connection between elements and an indirect electrical connection provided by intervening elements. For example, the attenuator 106 is coupled to the antenna 102 indirectly through the TV band select filter 104. An output of the attenuator 106 is coupled to an input of a low noise amplifier (LNA) 112, whose output is coupled to an input of a selectable filter (i.e., a selectable high-pass (HP), low-pass (LP) or all-pass (AP) filter) 116. As is shown, a radio frequency (RF) automatic gain control (AGC) circuit 114 controls the gain of the LNA 112 and the attenuation provided by the attenuator 106. An output of the filter 116 is coupled to an input of mixing DAC 118. The mixing DAC 118 includes a digital-to-analog converter (DAC) 120, whose first input receives the RF input signal ($RF_{IN}$) and whose output is coupled to an input of mixer (switching section) 124. A second input of the mixer 124 receives a digital in-phase local oscillator (LO(I)) signal from synchronization circuit 134.

The mixing DAC 118 also includes a DAC 122, which receives at a first input the RF input signal, and a mixer (switching section) 126. An output of the DAC 122 is coupled to a first input of the mixer 126. A second input of the mixer 126 receives a digital quadrature local oscillator (LO(Q)) signal from the synchronization circuit 134. In an ideal case, the LO signal provided to the second input of the mixer 126 is ninety degrees out-of-phase with the LO signal provided to the second input of the mixer 124. An output of the mixer 124 provides an intermediate frequency in-phase IF(I) signal and an output of the mixer 126 provides an IF quadrature IF(Q) signal. Depending upon the application, the IF(I) and IF(Q) signals may be baseband I and Q signals. As is depicted, a crystal 108 provides a reference frequency to a constant frequency phase locked loop (PLL) 130, which provides a constant frequency reference signal to a direct digital frequency synthesizer (DDFS) 132. Outputs of the DDFS 132 are coupled to inputs of the synchronization circuit 134, whose outputs, as previously mentioned, are coupled to the second inputs of the mixer 124 and the mixer 126, respectively. Polyphase filter (PPF) 128 converts the complex analog I and Q signals IF(I) and IF(Q) to a real analog signal.

With reference to FIG, 2 a exemplary embodiment of the selectable filter 116 is depicted. As is shown, differential outputs of the LNA 112 are coupled to inputs of the filter 116. It should be appreciated that depending on a position of the switches S1-S4 and S11-S14, resistors R1-R4 and R11-R14, respectively, may be utilized to filter a signal provided by the LNA 112. Similarly, depending on a position of switches S21-S26, capacitors C21-C23 may be utilized to filter the signal provided by the LNA 112. Additionally, depending on a position of switches S31-S33 resistors R31-R36 may be utilized to filter the signal provided by the LNA 112.

For example, an all-pass filter may be achieved by closing switches S4 and S14, while keeping all remaining switches open. Similarly a low-pass filter may be provided by opening switches S4 and S14 and, for example, closing switches S21 and S24, and/or S22 and S25 and/or S23 and S26 to, respectively, incorporate capacitors C21, and/or C22 and/or C23 within the filter configuration. Furthermore, closing switches S1, S2 and/or S3 incorporates resistors R1, R2 and R3, respectively, in parallel with the resistor R4 and closing switches S11, S12 and/or S13, respectively, incorporate resistors R11, R12 and R13 in parallel with resistor R14. Additionally, a high-pass filter may be achieved by, for example, closing switches S4 and S14 and one or more of switches S31, S32 and S33 to respectively incorporate resistors R31 and R34, and/or R32 and R35, and/or resistors R33 and R36 in the filter configuration.

The filter 116 may, thus, be configured to relax mixing DAC linearity requirements without degrading receiver noise performance or requiring any tunable circuits. The filter 116 may be particularly useful when a third-order or second-order harmonic of a local oscillator (2LO or 3LO) can down-convert a high frequency blocker that is still in a pass spectrum. This may happen, for example, with a low VHF band that suffers from both 2LO and 3LO harmonic blocking issues and with a high VHF band that suffers from 3LO blocking issues. In this case, the filter 116 may be configured as a low-pass filter to attenuate high frequency blockers that can be down-converted and adversely affect linearity of a mixing DAC.

A low frequency strong-blocker may also occur where a high frequency UHF channel has a valid TV channel at one-third of its frequency (RF/3). This low frequency strong blocker may be first up-converted from RF/3 to the RF frequency due to, for example, third-order distortion of an RF transconductance section of a mixing DAC. The blocker may then be down-converted to an intermediate frequency (IF). To lessen this effect, the filter 116 may be configured as a high-pass filter when receiving a UHF channel that has a VHF blocker at RF/3. As most TV channels do not have 3LO or RF/3 blocking issues, it is desirable for the filter 116 to be configurable in an all-pass configuration so as to not degrade the receiver noise performance when the 3LO or RF/3 blocking issues are not applicable. Thus, depending on the desired TV channel, a low-pass, a high-pass or an all-pass filter may be selectively formed between the LNA 112 and the mixing DAC 118. Modifying the corner frequency position of the low-pass and high-pass filters, based on the received TV channel, may provide large blocker attenuation and, therefore, relax mixer linearity requirements, while at the same time reducing power requirements for the receiver.

Figure 3:
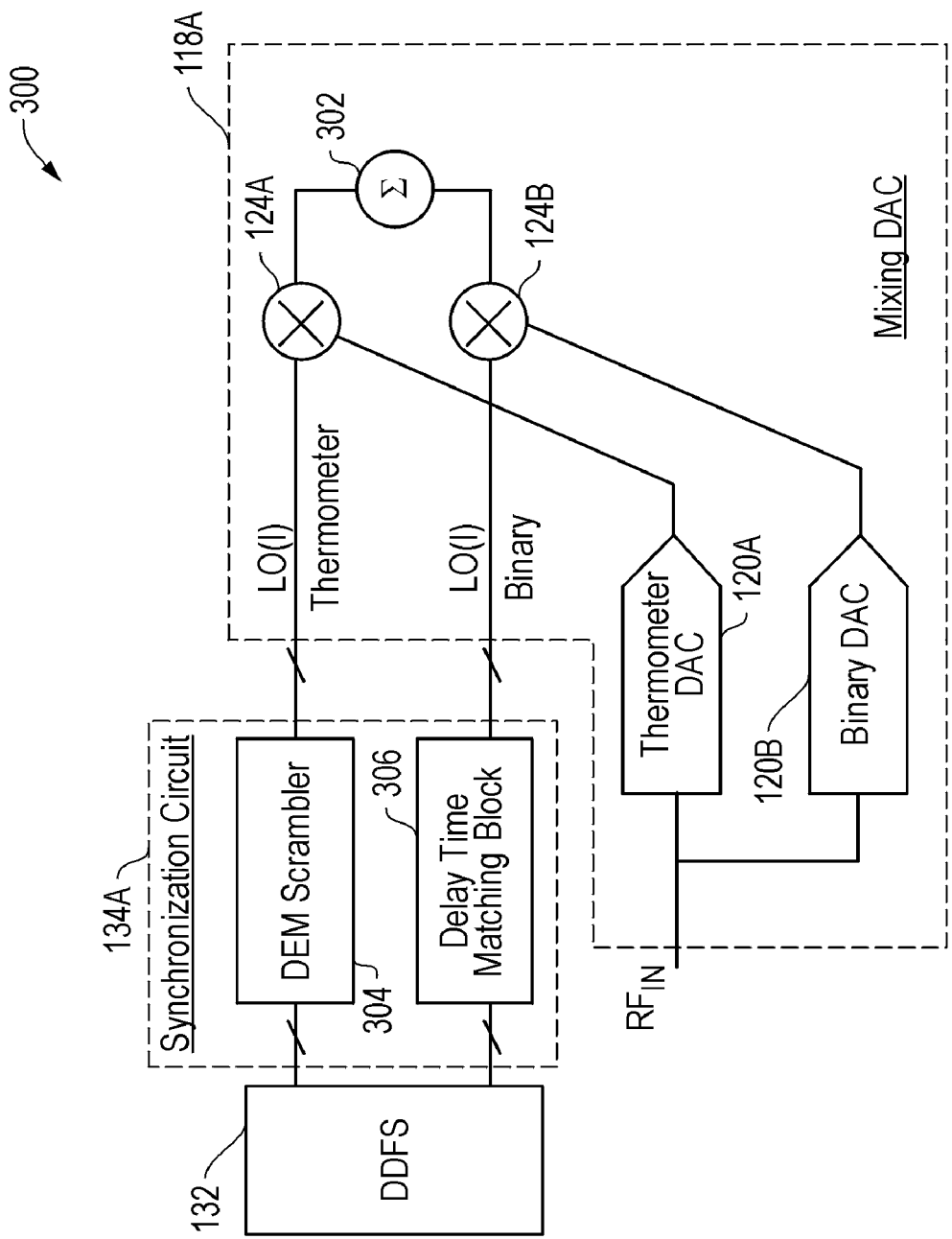
FIG. 3 is an electrical diagram, in block form, of a relevant portion of the receiver of FIG. 1 illustrating additional details of the synchronization circuit and mixing DAC, according to an embodiment of the present invention.

With reference to FIG. 3, a relevant portion of a receiver 300 is depicted that includes a synchronization circuit 134A coupled between a DDFS 132 and inputs of a mixing DAC 118A. It should be appreciated that a quadrature portion of the mixing DAC would be configured in a similar manner as that shown for the in-phase portion of the mixing DAC 118A. In general, the linearity of a DAC used in a mixing DAC architecture is dependent on factors including the area of the DAC, the number of bits of the DAC and whether the DAC is segmented and, if so, what encoding techniques are utilized. Usually, a larger area DAC provides better DAC linearity (i.e., improved integral non-linearity (INL)), which has a direct impact on spur free dynamic range (SFDR) performance of the DAC. Unfortunately, larger devices usually have increased parasitic capacitance values, which may adversely affect operating frequency and degrade higher frequency image rejection performance. Increasing the number of bits in a DAC also generally improves the mixer linearity. However, increasing the bits of a DAC normally requires that the area of the DAC similarly increases, which, as noted above, increases parasitic capacitance. Furthermore, additional bits require additional signal paths from the DDFS to the mixing DAC, which increases the power requirements of the DDFS.

As is depicted, the mixing DAC 118A includes a thermometer encoded section 120A and a binary encoded section 120B. While the implementation of a full binary encoded DAC results in a minimum number of digital bit lines and, thus, lowers power consumption, a differential non-linearity (DNL) performance of a full binary encoded DAC is relatively poor due to the mismatch of the most significant bits (MSBs), which may cause a strong second-order distortion that dominates the DAC spur free dynamic range (SFDR) performance. On the other hand, a full thermometer encoded DAC provides better DNL performance than the binary encoded DAC and provides a relatively high value SFDR performance, limited by third-order distortion. However, full thermometer encoded DAC implementations increase power dissipation, due to the large number of parallel DDFS digital signal paths (i.e.,; $2^N-1$ signal paths, where N is the number of thermometer encoded DAC bits).

A receiver with both high mixing DAC linearity and low power dissipation may be achieved by using a segmented DAC in which M MSBs are thermometer encoded while P least significant bits (LSBs) are binary encoded (see, for example, FIG. 3). For example, a ten-bit DAC may include five thermometer-encoded bits and five binary-encoded bits. Increasing the number of thermometer encoded MSBs, while resulting in higher power dissipation, generally improves 2LO and 3LO harmonic blocking of the mixing DAC. However, any mismatch between legs of a thermometer encoded DAC limit the SFDR performance of the DAC. DAC segmentation can be chosen in view of these factors. A good compromise for a ten-bit DAC is using M=5 thermometer bits ($2^M-1$ or 31 lines) and P=5 binary bits (or 5 lines).

In RF applications, the DAC size is limited by a required bandwidth of the RF transconductance stage of the mixing DAC and a switching speed of the switching pairs (Gilbert cells) of a switching section of the mixing DAC. To improve the LO harmonic blocking of the mixing DAC, a dynamic element matching (DEM) technique may be implemented to scramble the order in which the thermometer bits are used for a given code. That is, using different thermometer units for a given digital code average the DAC mismatch and, thus, scramble the harmonic frequency tones. It should be appreciated that a number of different scrambling techniques may be employed. Implementing DEM scrambling of the DDFS digital code output results in a spreading of the LO harmonics (i.e., 2LO, 3LO, etc. that dominate the mixing DAC SFDR) into noise, thus, improving the blocking performance of the mixing DAC. Ideally, the tones are scrambled such that they are spread into white noise. For example, a pseudo-random sequence generator may be employed in the DEM scrambler to spread the tones.

To reduce non-linearity that may result from scrambling thermometer bits of a segmented DAC, it may be desirable to delay the binary encoded bits provided by the DDFS such that the binary encoded bits have substantially the same arrival time, at associated switching pairs of the mixing DAC, as the scrambled thermometer bits. It should be appreciated that even when the arrival times of the thermometer encoded bits and the binary encoded bits are substantially equal, non-linearity may result due to a difference in switching times of the switching pairs. The difference in switching times may be attributed to, for example, different current levels in the binary and thermometer current legs. To compensate for the arrival time mismatch attributable to DEM scrambler 304, a delay time matching block 306 may be implemented for the binary encoded bits provided by the DDFS 132.

The DDFS 132 provides bits, for, driving mixers 124A and 124B, to the synchronization circuit 134A. The synchronization circuit 134A includes the DEM scrambler 304, which scrambles the thermometer encoded bits that are provided to the thermometer encoded section of the mixing DAC 118A. Similarly, as previously discussed, the binary encoded bits are provided to the delay time matching block 306, which delays the binary encoded bits an amount substantially equal to the delay introduced by the scrambling of the thermometer encoded bits such that the arrival times of the binary encoded bits to the inputs of the mixer 124B are substantially similar to the arrival times of the thermometer encoded bits to the inputs of the mixer 124A. In this manner, the circuit 134A tends to reduce the arrival times between bits provided to the mixer 124A, which receives bits for the thermometer encoded section of the DAC, and the mixer 124B, which receives bits for the binary encoded section of the DAC. As such, the linearity of the mixing DAC 118A is generally improved.

It should be appreciated that a mixing DAC may be implemented in a number of different configurations. For example, the mixing DAC may be implemented as a transconductance mixing DAC 400 (as is shown in FIG. 4), a cascode mixing DAC 500 (as is shown in FIG. 5) or a switching mixing DAC 600 (as is shown in FIG. 6). In the embodiment shown in FIG. 4, the mixing DAC includes a switching section (mixer) 402 and a DAC 404, which is considered to be implemented in an RF transconductance section that may use resistive degenerated common source transistors. In this implementation, the resistive degeneration reduces the capacitive loading of an associated LNA (not shown in FIG. 4) by bootstrapping a gate-to-source capacitance ($C_{gs}$) of the transistors of the RF transconductance section, which is described further below in conjunction with FIG. 7. In general, a larger resistive degeneration results in a smaller dependence on active device performance. In this case, the equivalent transconductance of the RF transconductance section is approximately equal to $1/R_{deg}$.

However, it should be appreciated that resistive degeneration also reduces a gain of the mixing DAC, as the gain of the mixing DAC is approximately equal to $R_L/2R_{deg}$, i.e., the value of the load resistor divided by two times the value of the degenerative resistor. As such, to achieve a desired gain may require using a relatively large load resistor $R_L$ for the mixing DAC. Moreover, good mixing DAC linearity requires providing a relatively high bias current in the RF transconductance section of the mixing DAC. Unfortunately, providing a relatively high bias current in the RF transconductance section generally reduces a voltage headroom at an output of the mixing DAC, as the bias current has traditionally flowed through the load resistor $R_L$.

Turning to FIG. 5, the mixing DAC 500 includes a switching section (mixer) 502, an RF transconductance section 506 and an RF cascode transconductance section 504. In this configuration, a size of the transistors of the RF transconductance section 506 are limited by a maximum loading capacity that may be presented to an associated LNA (not shown in FIG. 5). As gates of transistors of the RF cascode transconductance section 504 are commonly connected to a DC potential, the transistors do not load a signal path of the mixer 502. As such, the transistors of the RF cascode transconductance section 504 can usually be selected with a higher area, as compared with the transistors of the RF transconductance section 506. Further, a DAC built into the cascode transistors can generally achieve a better I/Q matching, as compared to a DAC built with grounded source RF transconductance transistors.

With reference to FIG. 6, the mixing DAC 600 presents another implementation of a mixing DAC, whose DAC can be considered to be implemented in a switching section (mixer) 602, with all switching pairs of the switching section sharing a same RF transconductance section 604. To minimize mixer noise, the switching pairs of mixer 602 need to use relatively small transistors that have a high transition frequency ($f_t$) to achieve fast switching. Unfortunately, high speed is generally not compatible with good matching of I/Q mixers.

Figure 7:
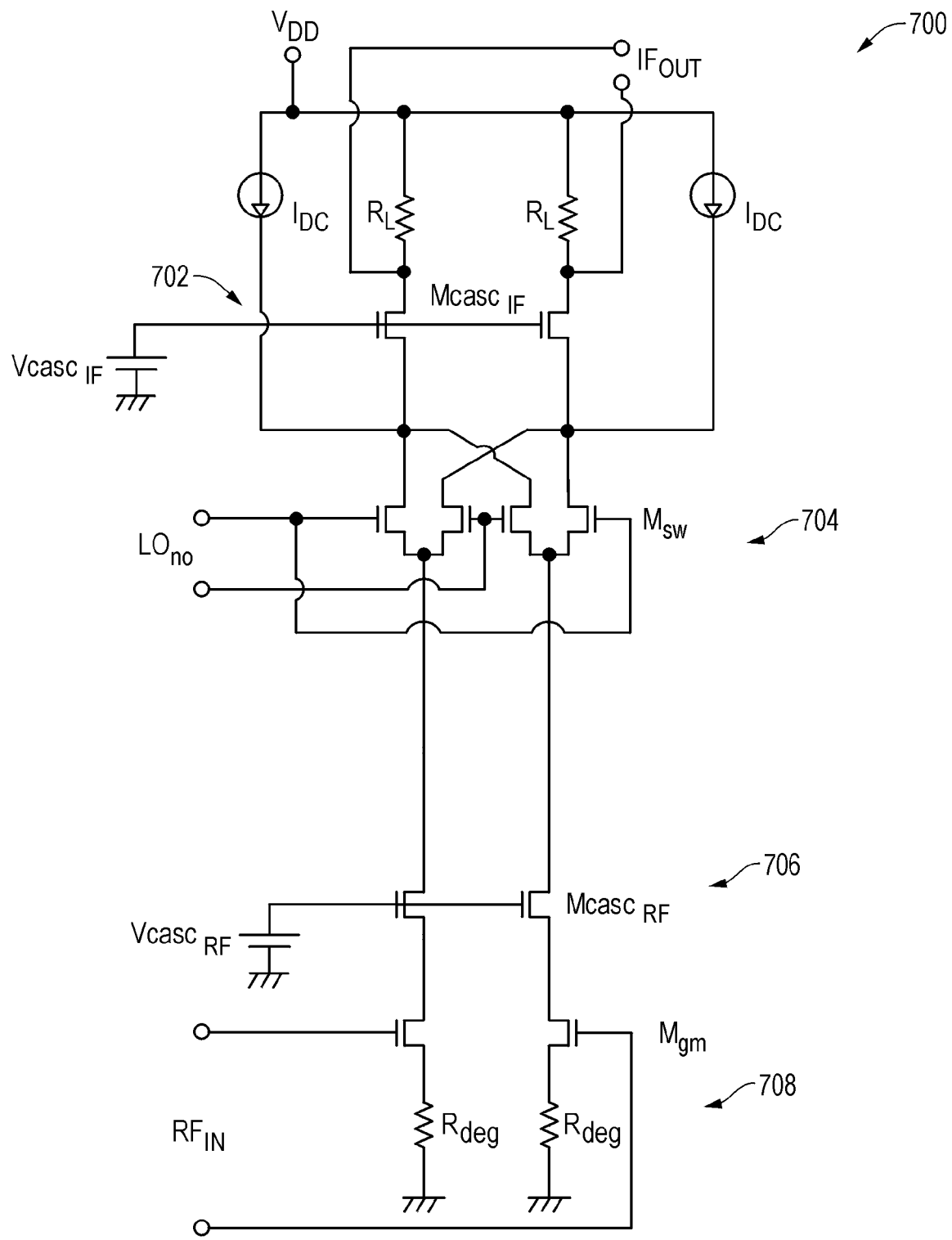
FIG. 7 is an electrical schematic of a relevant portion of a mixing DAC that implements a transconductance intermediate frequency (IF) section ($M_{cascIF}$) between a switching section ($M_{sw}$) of the mixing DAC and a load of the mixing DAC, according to an embodiment of the present invention.

Referring to FIG. 7, a relevant portion of an exemplary mixing DAC 700 is depicted that implements an RF transconductance DAC configuration (similar to that of FIG. 4). The mixing DAC 700 includes a differential input (at RF transconductance section ($M_{gm}$) 708) and a differential output (at IF transconductance section ($M_{cascIF}$) 702). As previously mentioned, an RF transconductance section of a mixing DAC normally requires a relatively large bias current to achieve acceptable linearity. As such, to provide for proper headroom at an output of a mixing DAC that implements a resistive load, it is desirable that a DC component of the mixing DAC bias current not flow through load resistors $R_L$. That is, if the DC bias current flows through the load resistors $R_L$ then a relatively large voltage drop may be created across the load resistors $R_L$. The voltage drop reduces the voltage headroom at the output of the mixing DAC which, in turn, reduces the available output voltage swing and decreases the achievable gain of the mixing DAC. As is shown, current sources $I_{DC}$ are added between a high-side of the load resistors $R_L$ (i.e., VDD) and outputs of switching section ($M_{sw}$) 704. It should be noted that a switching section is typically made-up of multiple sets of switches, similar to the set shown in FIG. 7. Sizes of the transistors are binary weighted for a binary-encoded section and equally weighted for a thermometer-encoded section. In this implementation, outputs of the sections are wire-Or'ed together In general, if the thermal noise contribution of the switching pairs is negligible, the optimum DC current subtractor source connection is at the switching pair output. In a typical case, the I/Q matching in the mixer signal path is dominated by the highest impedance node, usually the output resistor node, where parasitic device capacitance matching has a more significant impact. In this case, it is generally desirable for the IF cascode transistors of IF cascode transconductance section ($M_{cascIF}$) 702 to have a minimal size.

Figure 8:
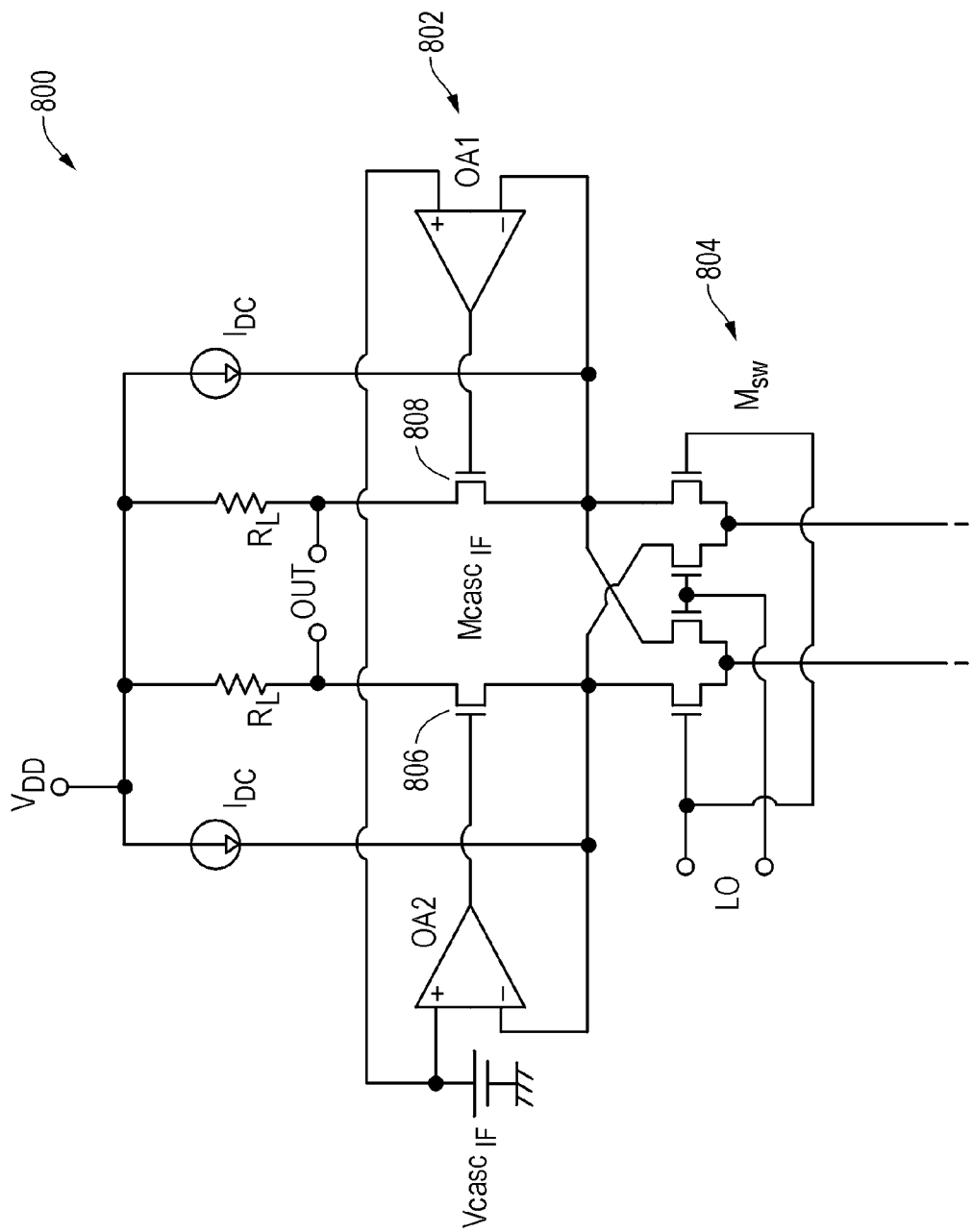
FIG. 8 is an electrical schematic diagram of a relevant portion of a mixing DAC that implements a boosted transconductance intermediate frequency (IF) section ($M_{cas-cIF}$) between a switching section ($M_{sw}$) of the mixing DAC and a load of the mixing DAC, according to another embodiment of the present invention.

With reference to FIG. 8, a relevant portion of a mixing DAC 800 is depicted that implements a boosted IF transconductance section ($M_{cascIF}$) 802 to improve matching in an IF path at an output of switching section ($M_{sw}$) 804. As is shown, operational amplifiers OA1 and OA2 drive the IF cascode transconductance section 802 to boost a transconductance of the section 802. More specifically, non-inverting inputs of operational amplifiers OA1 and OA2 are coupled to a voltage source $V_{cascIF}$, an output of OA2 is coupled to a gate of transistor 806 and an output of OA1 is coupled to a gate of transistor 808. An inverting input of the operational amplifier OA2 is coupled to a first terminal of transistor 806 and a first output of the switching section 804 and an inverting input of the operational amplifier OA1 is coupled to a first terminal of transistor 808 and a second output of the switching section 804. A second terminal of the transistor 806 is coupled to a low-side of a first load resistor $R_L$ and a second terminal of the transistor 808 is coupled to a low-side of a second load resistor $R_L$. As noted above, implementing transconductance boosting improves matching of the IF path.

Figure 9:
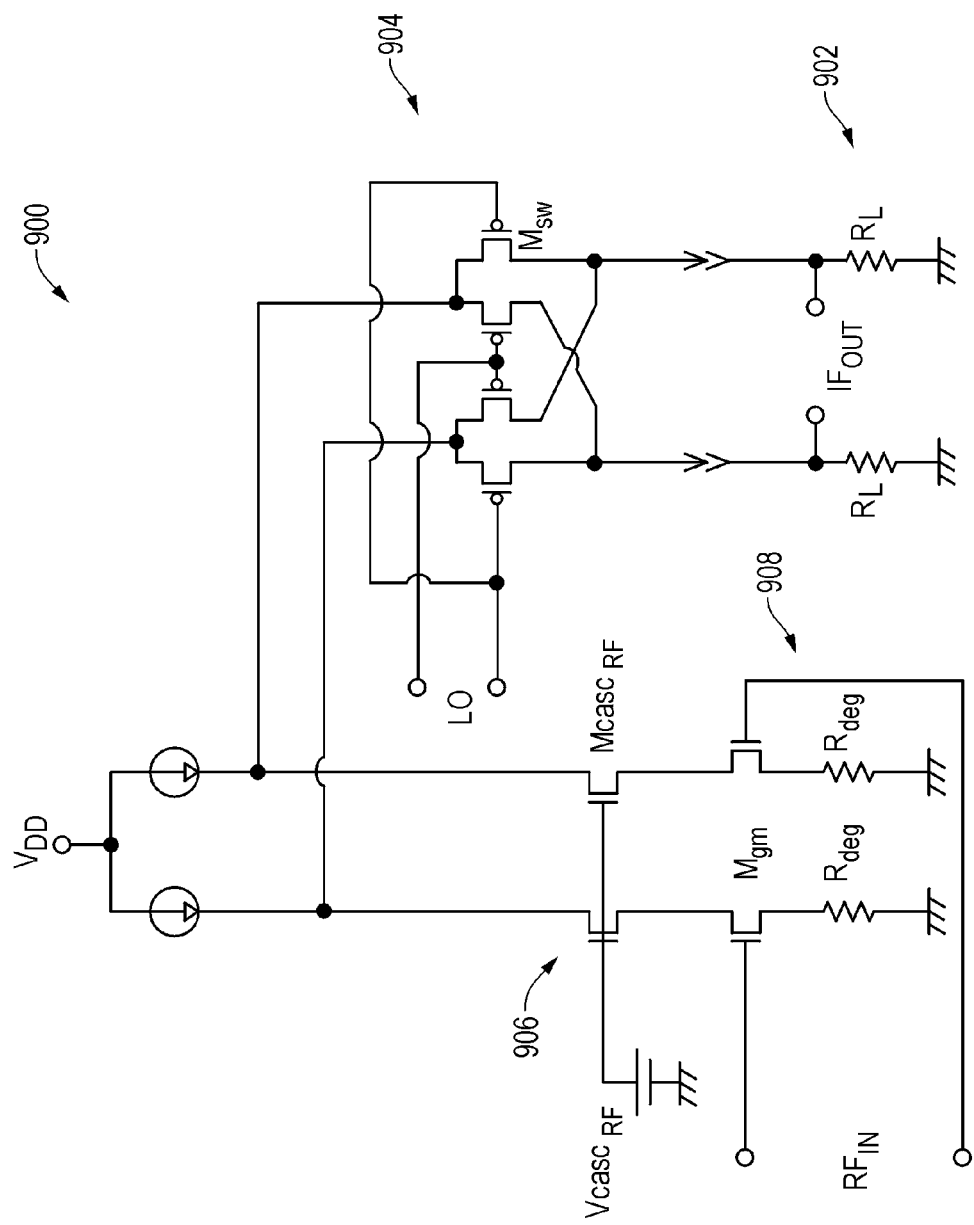
FIG. 9 is an electrical schematic diagram of a relevant portion of a mixing DAC that implements a folded architecture, which may be particularly useful in low IF applications, according to an embodiment of the present invention.
Figures 1, 9:
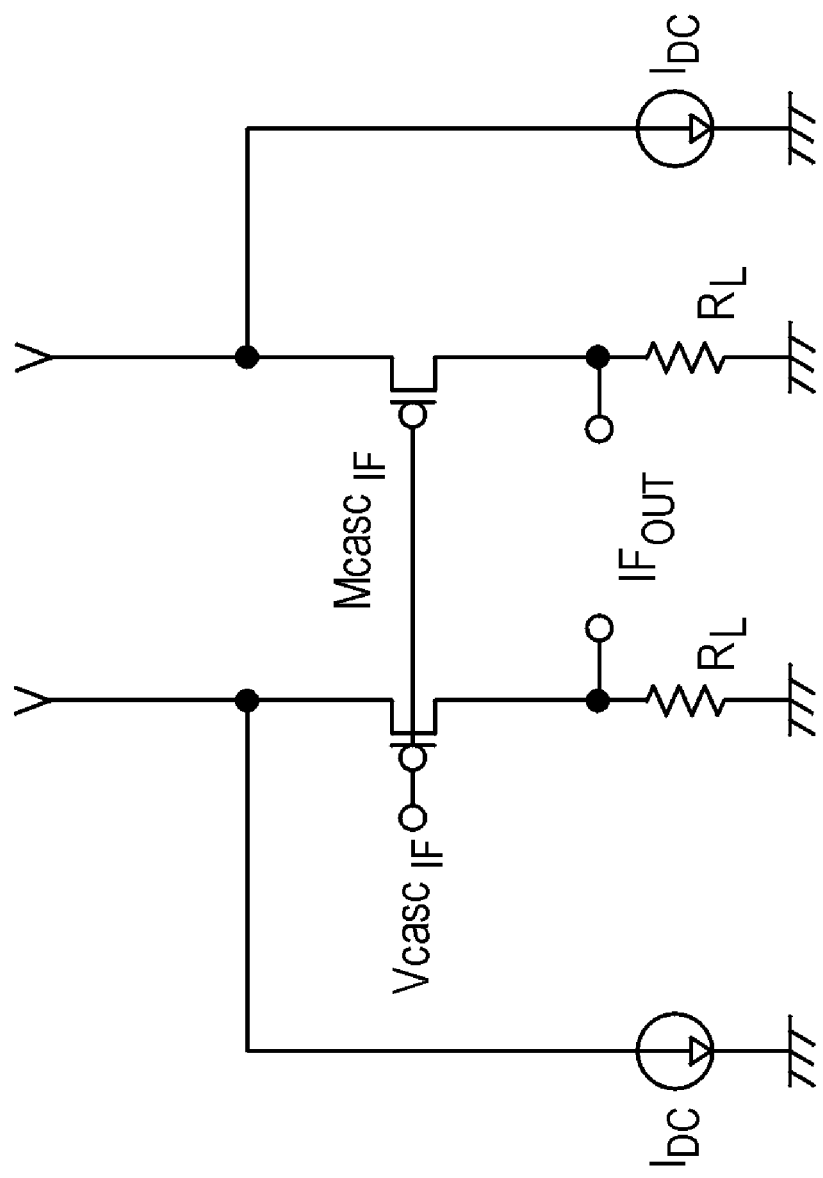

FIG. 9 depicts a relevant portion of a mixing DAC 900 that is implemented in a folded configuration. As is shown, an RF transconductance section ($M_{gm}$) 908 of the mixing DAC 900 includes N-channel field-effect transistors (NFETs) and a switching section ($M_{sw}$) 904 of the mixing DAC 900 includes P-channel FETS (PFETs). In general, PFETs have a much lower 1/f noise (or flicker noise). However, PFETs generally switch slower than NFETs and have a lower transconductance than NFETs. As such, mixing DACs that implement PFETs may exhibit degraded noise performance and lower image rejection ratio, as compared to mixing DACs that implement NFETs. As is shown, the RF transconductance section 908 implements resistive degeneration (i.e., resistors $R_{deg}$) which reduces the flicker noise of the transconductance section 908. As such, a worse match can be tolerated in switching pairs of the switching section 904 without generating a large 1/f noise leakage from the RF path. In general, the implementation of NFET transistors in the RF path results in better linearity and matching which results in a lower power dissipation and a higher image rejection ratio. Implementing PFETs in the switching section results in a lower flicker noise up-conversion in the IF band. Furthermore, implementing NFETs in the RF transconductance section 908 generally provides better linearity with lower mixing currents and, thus, lower switching noise impact. In general, the mixing DAC 900 is well suited for low IF receivers.

With reference to FIG. 9-1, load 902 of FIG. 9 may be replaced with circuit 902A, which includes a cascode IF transconductance section ($M_{cascIF}$) and current sources (i.e., current subtractors) $I_{DC}$, which are implemented to reduce the bias currents that flow through the load resistors $R_L$. The current sources $I_{DC}$ may be realized using a source follower with a serially coupled resistor. As previously noted, reducing the bias currents that flow through the load resistors $R_L$ increases a voltage headroom at the output of the mixing DAC.

Figure 10:
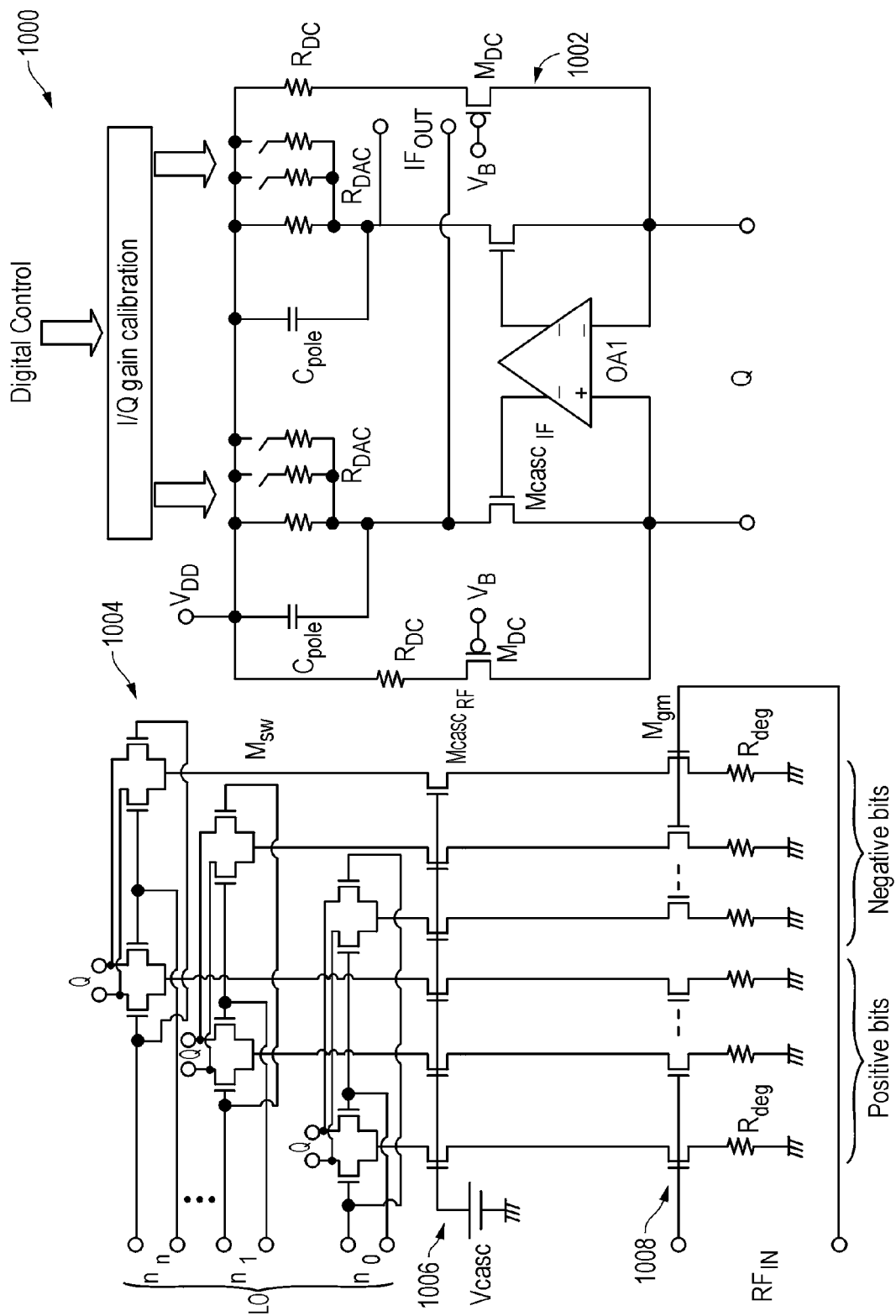
FIG. 10 is an electrical schematic diagram of a mixing DAC having a telescopic configuration with a resistive DAC ($R_{DAC}$) load and a differentially boosted IF transconductance section ($M_{caseIF}$) coupled between an output of a switching section ($M_{sw}$) and the load of the mixing DAC, according to an embodiment of the present invention.

Referring to FIG. 10, a relevant portion of a mixing DAC 1000, having a telescopic configuration, is depicted. As is shown, an RF transconductance section ($M_{gm}$) 1008 provides a differential input and includes a plurality of NFET transistors, each of which have resistors $R_{deg}$ coupled between sources of the transistors and ground to provide resistive degeneration. The value of the resistors $R_{deg}$ are selected based upon whether a full binary encoded DAC, a full thermometer encoded DAC or a segmented DAC is implemented. An RE cascode section ($M_{cascIF}$) 1006 biases the transistors of the section 1008. As is also depicted, a switching section ($M_{sw}$) 1004 includes switching pairs (Gilbert cells) for each bit provided from an associated DDFS. Outputs of the switching section 1004 are coupled to a cascode IF transconductance section ($M_{cascIF}$) 1002, which implements transconductance boosting via differential operational amplifier OA1.

Loads ($R_{DAC}$) for the mixing DAC 1000 are implemented as resistive DACs. Capacitors ($C_{pole}$) are implemented as matched load capacitances to limit an output bandwidth of the mixing DAC 1000 and, in this manner, relax linearity requirements on the IF transconductance section 1002. It should be appreciated that I/Q matching is also impacted by the operational amplifier OA1 gain bandwidth (GBW) product matching between I and Q mixing DACs. In general, good transconductance (gm) boosting operational amplifier matching requires good matching of all related passive components. Active device matching may be improved by using resistive degeneration in the RF transconductance section 1008 and in the load current sources (i.e., resistors $R_{DC}$) and in the active amplification sections.

In a receiver using quadrature mixers, image rejection is strongly dependent on matching of circuits in the LO path. In general, a signal edge speed in the LO path determines a noise contribution of switching devices of a mixer. When operating at multi-GHz frequencies, the signal edge speed can dominate the mixer noise figure. In the case of a mixing DAC, the LO signal is present in digital format provided by a direct digital frequency synthesizer (DDFS). In general, an interface between a DDFS and inputs of a current commutating mixing DAC should ensure good synchronism between individual bits provided by the DDFS. Matching of the LO path circuitry controls receiver image rejection performance, while signal edge speed controls noise figure performance. In a typical implementation, a DDFS generates $2^N$ bit digital signals that represent two quadrature LO signals that are stored in output registers of the DDFS.

As previously mentioned, the linearity of a complex mixing DAC is determined by the synchronization of the bits provided by the DDFS arriving at the input of the two mixers (i.e.; the I mixer and the Q mixer). Any mismatch between the different arrival times of the bits going to a given mixer results in a harmonic distortion in the mixing DAC that may down convert a large blocker that can significantly deteriorate a signal-to-noise ratio (SNR) of an associated receiver. The mismatch between the average arrival time of the I/Q digital LO signal at the mixer inputs can result in a finite I/Q phase mismatch that may also degrade the image rejection performance of the receiver. To achieve both a good harmonic rejection and a high image rejection, a synchronization circuit may be implemented between a DDFS and inputs of a mixing DAC to ensure that bits provided by the DDFS arrive at inputs of the mixing DAC at substantially similar arrival times.

Figure 11:
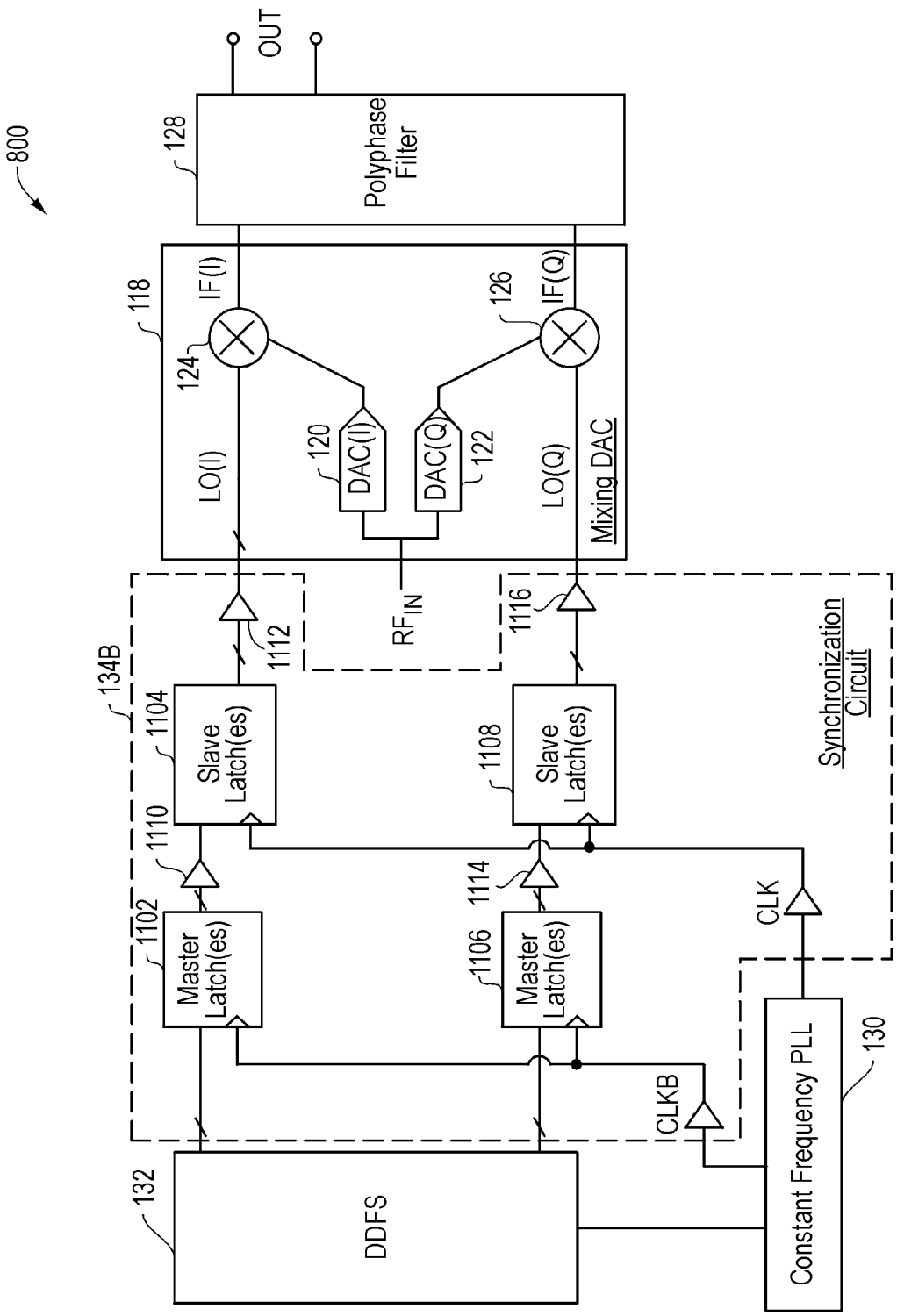
FIG. 11 is an electrical diagram, in block and schematic form, of a relevant portion of a receiver having a mixing DAC and a synchronization circuit that ensures that bits provided by a direct digital frequency synthesizer (DDFS) have substantially similar arrival times at inputs of the mixing DAC, according to another embodiment of the present invention.

As is shown in FIG. 11, a synchronization circuit 134B includes a plurality of master latches 1102 (e.g., one for each I bit) that each include an input coupled to a respective output of the DDFS 132 and an output coupled to a respective input of an associated one of slave latches 1104. As is shown, the outputs of the slave latches 1104 are coupled to inputs of the in-phase (I) mixer 124 of the mixing DAC 118. Similarly, an input of each of a plurality of master latches 1106 (e.g., one for each Q bit) receives digital bits from DDFS 132. Outputs of the master latches 1106 are coupled to inputs of slave latches 1108, whose outputs are coupled to inputs of the quadrature mixer 126 of the mixing DAC 118. It should be appreciated that depending upon the application, a single latch within each of the paths from the DDFS 132 to the input of the mixers 124 and 126 of the mixing DAC 118 may suffice to provide a sufficiently synchronized signal such that the linearity of the DACS of the mixing DAC 118 may be maintained at a sufficient level. Moreover, each of the latches 1104 and 1108 may provide a bit and its complement bit to inputs of the mixers 124 and 126, respectively, when a split mixing DAC architecture is implemented. Alternatively, the DDFS 132 may provide a complement bit for each bit.

The synchronization circuit 134B may also implement buffers 1110, coupled between the outputs of the master latches 1102 and inputs of the slave latches 1104, and/or buffers 1112, coupled between the outputs of the slave latches 1104 and associated inputs of the mixer 124 of the mixing DAC 118. Similarly, the synchronization circuit 134B may also implement buffers 1114, coupled between the outputs of the master latches 1106 and inputs of the slave latches 1108, and/or buffers 1116, coupled between the outputs of the slave latches 1108 and associated inputs of the mixer 126 of the mixing DAC 118.

With respect to propagation time mismatch, it may be desirable to implement a single latch on each line between the DDFS 132 and the mixing DAC 118. However, it should be appreciated that latches usually have some form of positive feedback that may cause a slower slew rate of the logic state regeneration process, particularly when a large load capacitance is present. Receiving a low slew rate signal at the input of the mixer generates I/Q phase mismatch, due to the threshold voltage mismatch of the mixer switching pairs. In general, a better I/Q phase mismatch can be obtained by using a buffer, at the output of each of the slave latches, to drive the mixer switching pairs. It should be appreciated that the buffers 1112 and 1116 may results in some I/Q phase mismatch. However, assuming the buffers 1112 and 1116 speed-up the signal at their input (due to a lower capacitance loading as compared to the mixer switching section) and at their output (due to a larger drive capability) then the buffers provide an overall improvement in the I/Q phase mismatch performance. While driving the mixer directly from the DDFS output registers offers the lowest power dissipation, layout asymmetries may provide significant I/Q phase mismatches that degrade the image rejection performance of the receiver.

Using only a single latch in the synchronization circuit provides one-half of a period of a data cycle for all delays between the outputs of the DDFS and the inputs of the mixing DAC. A better time margin may be achieved with the master-slave latch architecture in which the total time budget is equal to one full period of the data cycle. In general, the master-slave configuration requires two clock signals, i.e. CLK and CLKB (the complement of the CLK signal), to drive the two latched sections. In a fully differential system, the two complimentary clock signals may be obtained by swapping the clock wires. As noted above, driving a latch from another latch may result in a slow slew rate at the intermediate point between the latches, due to the large capacitive loading and positive feedback of the latches. However, as also noted above, locating a buffer between an output of the master latches and an input of the slave latches generally improves the slew rate of the signal provided from the master latch to the slave latch. Optimum power dissipation in the synchronization circuit may be realized by increasing device sizes such that the device size is matched with a desired slew rate. Placing buffers between the master and slave latches also generally improves set-up and hold conditions of the slave latch.

In a receiver employing a full-rate DDFS, it is desirable to design an interface to have an optimal sampling point. In a full-rate system, both the DDFS and the latches (synchronization circuit) are operating at the same clock frequency, which is provided by a constant frequency PLL. In general, if the DDFS is synthesized using a digital clock frequency (without any internal clock buffer), then a single relatively large size clock buffer can be used to drive both internal latches of the DDFS and the latches of the synchronization circuit. However, in most cases, the synthesizing process for the DDFS uses an internal clock buffer and includes additional delay cells, which were, for example, introduced to meet set-up and hold conditions. Unfortunately, the DDFS also may introduce process and temperature dependant time delays that are not present in a clock path of the synchronization circuit and, as such, data provided by the DDFS may not be aligned with a clock signal provided to the latches. Usually, simple inverters have propagation times that track fairly well over process and temperature, assuming the inverters are scaled-up versions of a unit inverter. In this case, one solution to achieve a relatively good bit sampling position for a synchronization circuit is to manually design buffer chains in a clock path of the DDFS to ensure data sampling occurs at a same point in each clock cycle.

Figure 12:
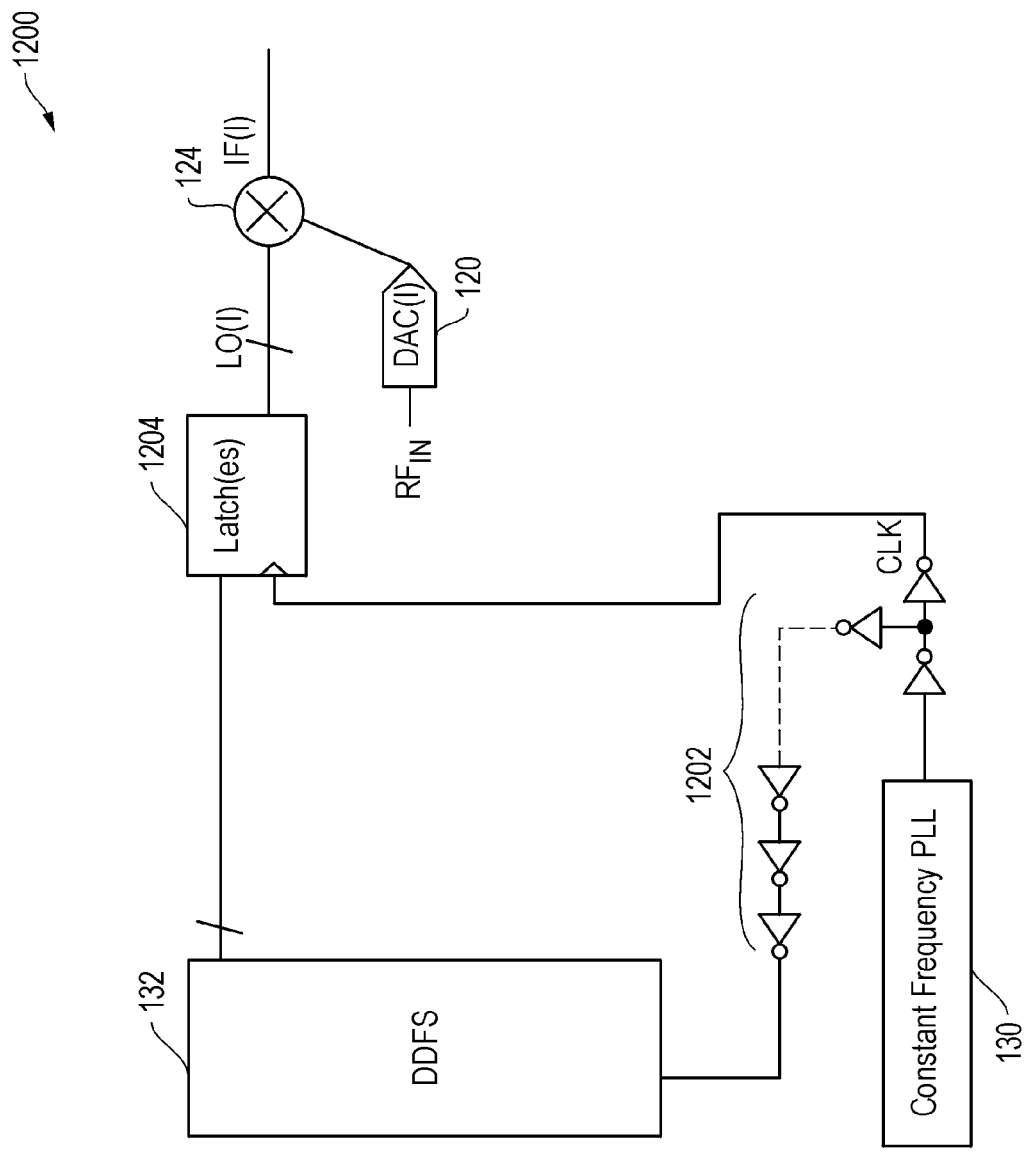
FIG. 12 is an electrical diagram, in block and schematic form, of a relevant portion of a receiver having a manually selected buffer chain selected for ensuring that bits provided by a DDFS have a substantially optimum sampling point, according to an embodiment of the present invention.

Turning to FIG. 12, a relevant portion of a receiver 1200 is depicted that includes a manually tuned buffer chain 1202 that aligns data provided by the DDFS 132 with a clock signal (CLK) that clocks latches 1204. It should be appreciated that the CLK signal that drives the latches 1204, e.g., master-slave latches, should exhibit relatively small jitter (i.e., phase noise). As such, a minimum number of cascaded buffers should usually be implemented in the clock path between the PLL 130 and the latches 1204. In general, extra delay cells are added to the buffer chain 1202 to guarantee a sampling point at a same point each clock cycle. Unfortunately, one drawback of manual tuning is the lack of design robustness over operating frequency range. Another drawback of manual tuning is the inaccuracy of simulation models.

Figure 13:
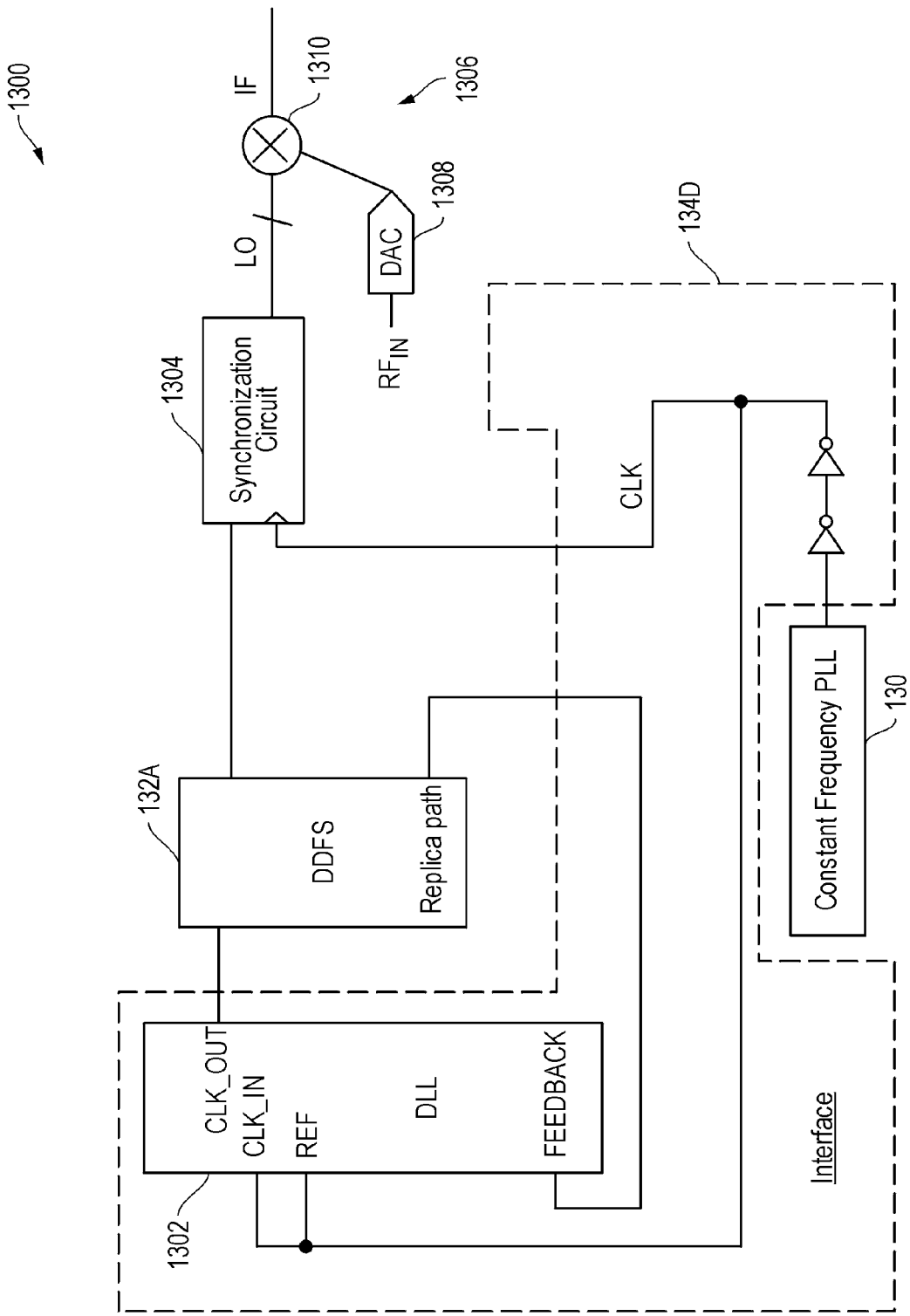
FIG. 13 is an electrical diagram, in block and schematic form, of a relevant portion of a receiver having an interface for ensuring that bits provided by a DDFS have a substantially optimum sampling point, according to an embodiment of the present invention.

Generally, more robust sampling time positioning can be achieved by implementing a delay locked loop (DLL) 1302 within receiver 1300 of FIG. 13. More particularly, interface 134D includes a DLL 1302 that receives a clock signal (CLK), which is adjusted by the DLL 1302. The adjusted clock signal is then provided to a clock input of the DDFS 132A. The DDFS 132A is essentially the same as the DDFS 132 of FIG. 12, with the exception that the DDFS 132A includes a replica path that mirrors a data path of the DDFS 132A and provides a feedback signal to a feedback input of the DLL 1302. The DLL 1302 monitors a phase relationship between the signal provided by the replica path of the DDFS 132A and the CLK signal and adjusts the delay of the DLL 1302 to align the data provided by the DDFS 132A and the CLK signal. It should be appreciated that this technique generally increases the die area required for a receiver IC, as well as the power requirements for the IC.

In sum, the clock (CLK) signal that drives the latches of the synchronization circuit is also passed through the DLL 1302. The replica path of the DDFS 132A provides a signal that has the same delay as the main data path of the DDFS 132A. The feedback loop drives the delay in the DLL 1302 such that the CLK signal and the data at an input of synchronization circuit 1304, e.g., an input of a master latch of a master-slave latch pair, are aligned. Aligning the data and the clock signal at the input of the synchronization circuit causes the clock at the slave latch to fall in the middle of the data cycle and, therefore, provide a substantially maximum time margin budget for both positive and negative propagation time events. It should be appreciated that the DLL 1302 can be controlled in an analog or digital manner. In general, a digital DLL implementation offers a more flexible design that can be readily controlled by a state machine (SM). A digitally controlled DLL can also accept a variable digital control offset signal to debug operation of the DLL.

In a typical terrestrial TV application, a 3 GHz DDFS clock signal may be utilized to clock data from a DDFS. It should be appreciated that designing and operating a complex synthesized digital circuit, such as a DDFS, at 3 GHz is relatively challenging, even when modern deep submicron (e.g., 0.13 micron) CMOS processes are used. In general, custom digital DDFS circuits can be realized for higher operating frequencies, assuming a long enough design time period. One solution to address the DDFS design time issue is to use a multiplexed DDFS architecture. In this design, instead of having a single DDFS core that outputs data at a full clock rate, multiple DDFS cores are used to provide consecutive values of the LO digital signal to inputs of a mixing DAC at a fraction of the full clock rate. For example, each of N DDFSs may provide data at a frequency that is 1/N of a clock frequency.

Figure 14:
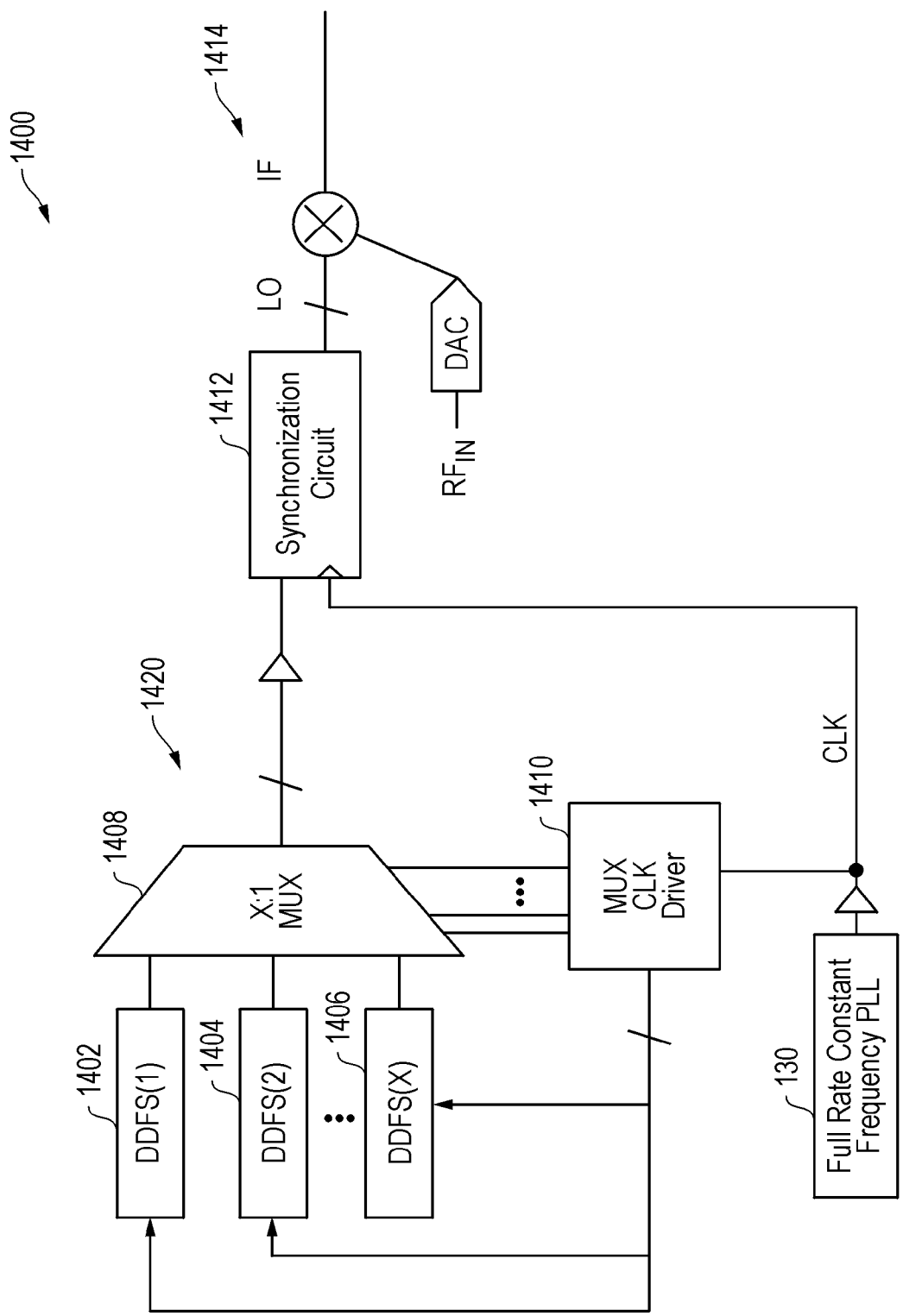
FIG. 14 is an electrical diagram, in block and schematic form, of a relevant portion of a receiver that includes multiple DDFSs that are multiplexed to consecutively provide bits at inputs of a mixing DAC, according to another embodiment of the present invention.

With reference to FIG. 14, a relevant portion of a receiver 1400 is depicted that includes an interface 1420 that couples multiple DDFS cores 1402, 1404 and 1406 to a synchronization circuit 1412. While three DDF cores are shown in FIG. 14, it should be appreciated that more or less cores can be implemented depending upon the application. As is shown, the outputs of the DDFS cores 1402, 1404 and 1406 are coupled to different inputs of an X:1 multiplexer (MUX) 1408. The MUX 1408 is utilized to consecutively select outputs from a different one of the DDFS cores 1402-1406. In general, using N parallel DDFS cores reduces by a factor of N the operating frequency of the synthesized digital circuit. For example, if a full-rate DDFS is required to generate data at 30 Hz, three parallel DDFS cores may operate at a frequency of 1 GHz and generate the same data. Implementing three 1 GHz DDFS cores is readily achievable using CMOS processes that are widely used today in the manufacturing of ICs. It should, however, be appreciated that multiplexing the DDFS core outputs require that the interface 1420, which couples the DDFS cores 1402-1406 to inputs of synchronizations circuit 1412, deliver data at the full rate. In general, such an implementation reduces design time and, thus, decreases the time to market for a product (albeit at a larger power dissipation for the product).

The MUX 1408 is driven by a clock select signals that select one of the parallel DDFS outputs at a given time. In this manner, data from the selected DDFS core is provided to the synchronization circuit 1412 and then to inputs of mixing DAC 1414. In a typical multiplexed DDFS architecture there are three clock domains (i.e. the full-rate clock driving the synchronization circuit, the divided down clock that drives the parallel DDFS cores and the MUX clock lines). It should be appreciated that a multiplexed DDFS implementation should ensure proper phase alignment between the different clock domains and data streams. As previously discussed, a manual alignment of the different clock and data signals may be achieved by adding/subtracting inverters from the corresponding paths. However, this technique may lack robustness over process and temperature variations. In general, a better technique is to implement a closed-loop DLL circuit that automatically aligns the referencing sample clocks and, thus, ensures the accuracy of alignment. In this implementation, the accuracy of alignment is limited by the comparative phase offset and resolution of the DLL propagation time adjustment. Alignment at both the MUX 1408 and the synchronization circuit 1414 may be achieved with, for example, two DLLs. In a typical application, the two DLLs utilize the same reference clock such that the clock and data streams essentially track.

Figure 15:
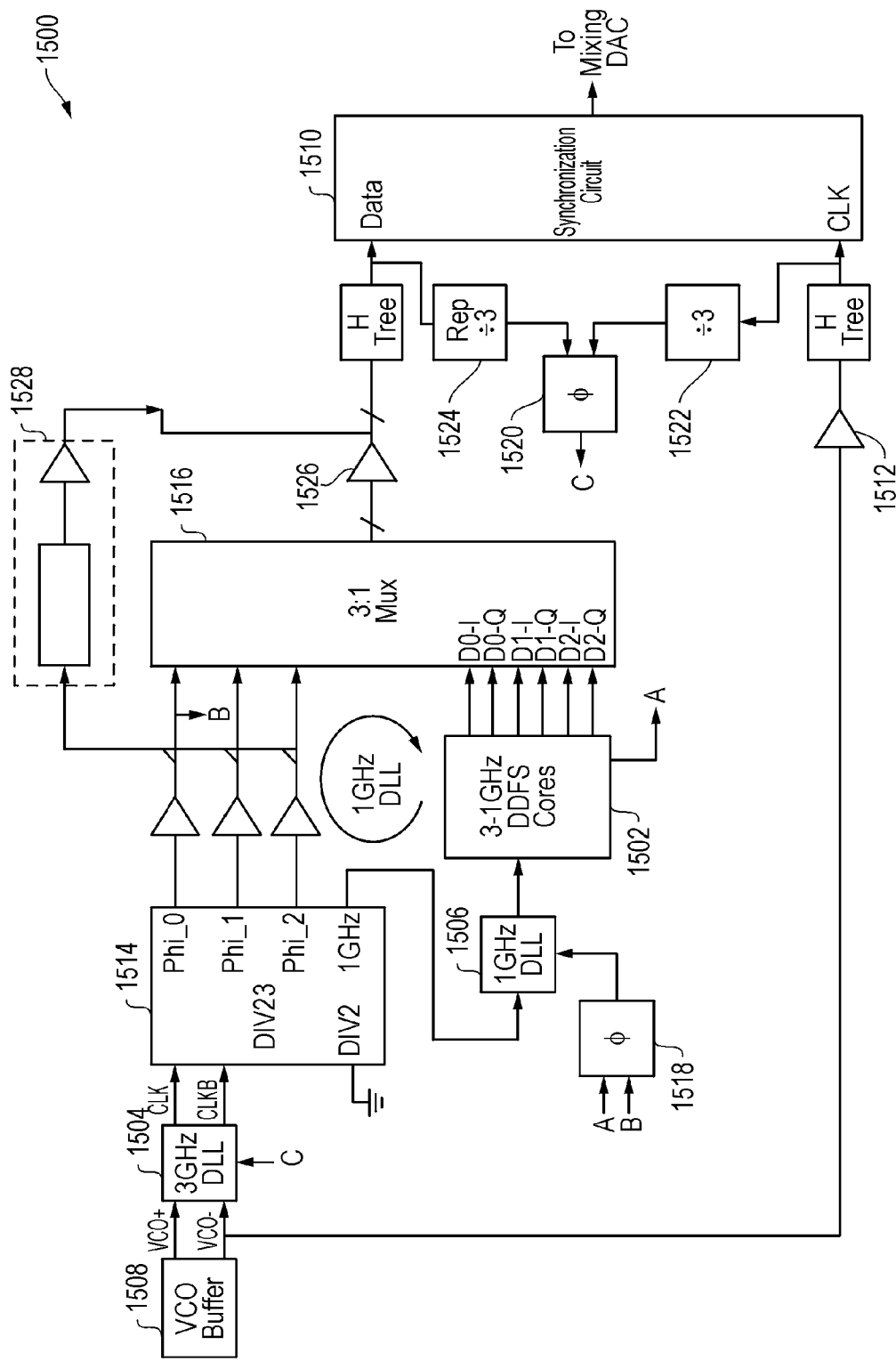
FIG. 15 is an electrical diagram, in block and schematic form, of a relevant portion of a receiver that implements multiplexed partial-rate DDFSs to provide a full-rate signal to inputs of a mixing DAC, according to an embodiment of the present invention.

FIG. 15 depicts a relevant portion of an exemplary receiver 1500 that includes three 1 GHz DDFS cores 1502 and two DLLs (i.e. a 3 GHz DLL 1504 and a 1 GHz DLL 1506). In this embodiment, a full-rate 3 GHz VCO buffer 1508 provides a 3 GHz clock (CLK) signal to synchronization circuit 1510. A clock buffer 1512 may be implemented to provide a fast edge slew rate CLK signal, within a given power budget and for a given input capacitance, to the synchronization circuit 1510 clock (CLK) input. The full-rate (3 GHz) clock passes through the full-rate DLL 1504, which drives a divide-by-three circuit 1514, which provides select clocks (Phi_0, Phi_1 and Phi_2) to multiplexer 1516. The DLL 1504 also provides a fifty percent duty cycle 1 GHz clock that drives the DDFS cores 1502, through the 1 GHz DLL 1506. The 1 GHz DLL 1506 ensures that the parallel data (D0-I, D0-Q, D1-I, D1-Q, D2-I and D2-Q), provided by the three DDFS cores 1502, respectively, and the three select signals (Phi_0, Phi_1 and Phi_1) are substantially aligned.

The reference clock for the 1 GHz DLL 1506 is the Phi_0 signal. The feedback signal, or sample clock signal (signal 'A'), is provided by a DDFS replica path of DDFS 1502 to an input of a 1 GHz phase comparator 1518. The DDFS replica path tracks a delay time of a main data path. The 1 GHz phase comparator 1518 compares the sample clock signal and the Phi_0 clock signal (signal 'B') and controls the DLL 1506 propagation delay such that the inputs of the phase comparator 1518 are substantially aligned. If the Phi_0 clock is substantially aligned with the replica of the D0 data signal, then the Phi_1 and D1 and Phi_2 and D2 pairs are also substantially aligned. The 3 GHz DLL 1504 guarantees that the data provided to inputs of the synchronization circuit 1510 and the CLK signal are substantially aligned to provide a substantially optimum data sampling point for the synchronization circuit 1510. The 3 GHz DLL 1504 moves the entire clock system, as the 1 GHz DLL 1506 is contained inside the 3 GHz DLL 1504 loop. In this manner, the 1 GHz DLL 1506 tracks the 3 GHz DLL 1504.

In general, a full-rate phase comparator having a low static phase offset may be difficult to implement in CMOS processes that are presently widely available. As such, instead of implementing a full-speed phase comparator, a lower-speed phase comparator may be utilized. For example, a 1 GHz phase comparator 1520 may be utilized for the 3 GHz DLL 1504. In this case, a divide-by-three 1522 may be utilized to derive a 1 GHz reference clock from the 3 GHz clock (CLK signal). It should be appreciated that the divide-by-three 1522 needs to have a relatively low propagation delay value. As is shown, a replica circuit 1524 of the divide-by-three 1522 is included to match a delay time of the divide-by-three 1522. In this embodiment, the data has a variable rate different from the 1 GHz frequency of the reference clock. Therefore, a 3 GHz DLL replica path 1528, which operates at 1 GHz and is driven by the Phi_0 signal, is introduced. The replica path 1528 matches the delay time of the multiplexer 1516 and buffers 1526 and the signal that traverses the replica path 1528 is provided to an input of the replica circuit 1524. In this manner, both data and clock inputs to the synchronization circuit 1510 have the same reference signal (i.e., the Phi_0 signal) and, as such, all clock and data streams are driven in synchronization.

In a typical application, timing issues are predominantly directed to first data sampling (in the above case Phi_0) and last data sampling (in the above case Phi_2). The first data sampling has set-up time issues while the last data sampling has hold time issues. The receiver 1500 may require rather stringent design requirements be placed on DLL time resolution and jitter performance, which may result in a relatively large power dissipation. However, it should be appreciated that having three select signals for the MUX 1516 means that the three different data streams (i.e. D0, D1 and D2), provided by the parallel DDFS cores 1502, do not need to be available at the same time for sampling.

Figure 16:
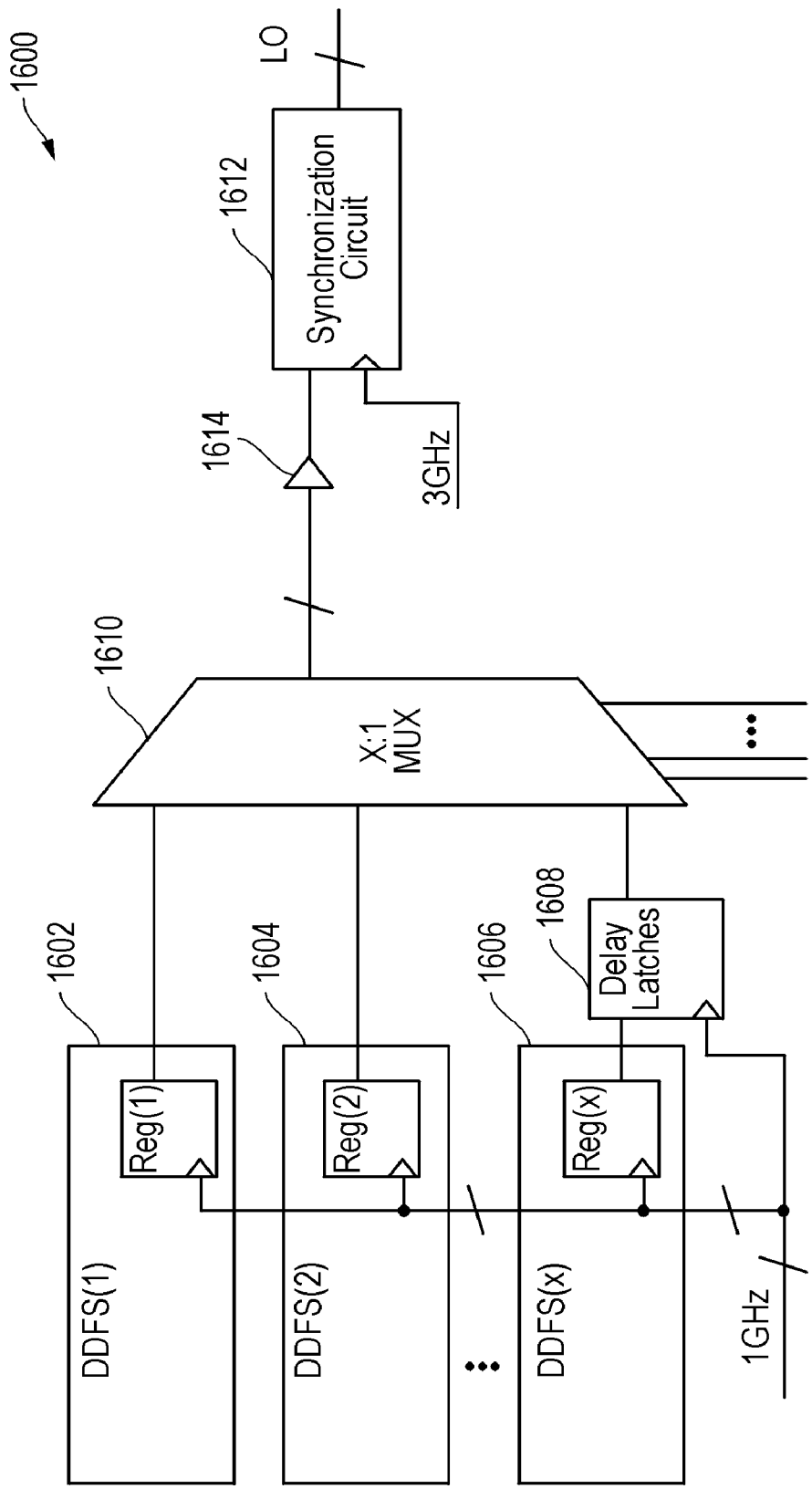
FIG. 16 is an electrical diagram, in block and schematic form, of a relevant portion of a receiver that implements multiplexed partial-rate DDFSs (one of which has its output delayed to a next cycle such that set-up and hold times of a synchronization circuit may be relaxed) to provide full-rate input to a mixing DAC, according to another embodiment of the present invention.

In FIG. 16 a relevant portion of a receiver 1600 is depicted that implements multiplexed DDFS cores 1602, 1604 and 1606 that are used to provide full-rate DDFS data in a manner similar to the receivers of FIGS. 14 and 15. However, the receiver 1600 implements delay latches 1608 on outputs of the DDFS core 1606, while data from the DDFS cores 1602 and 1604 are directly provided to associated inputs of MUX 1610. Delaying the data stream provided by the DDFS core 1606 extends the total budget time over one parallel clock period which generally results in a more robust design. While only three DDFS cores ate shown in FIG. 16, it should be appreciated that the concept can be extended to receivers that implement more or less than three reduced-rate DDFSs.

Figure 17:
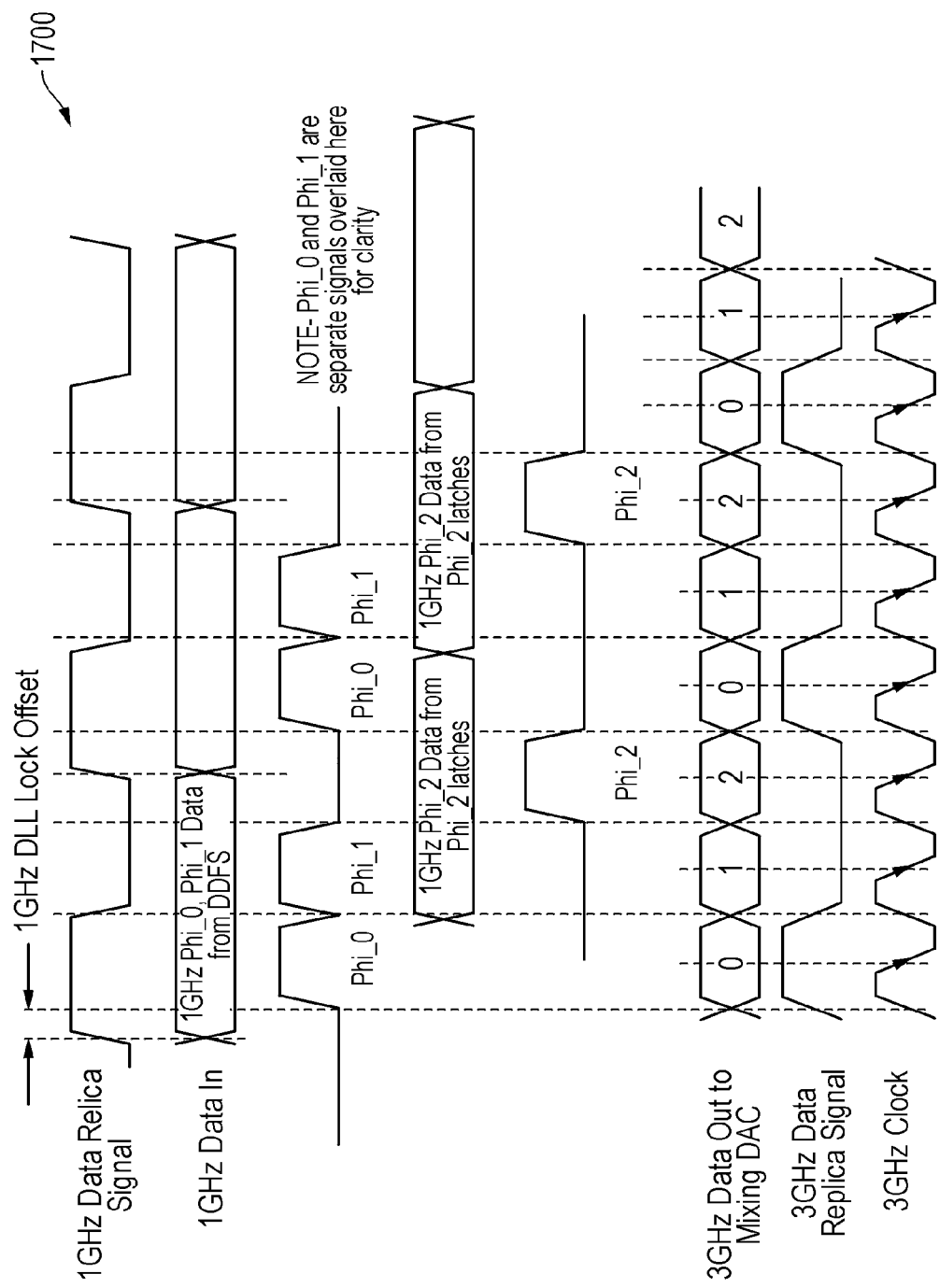
FIG. 17 is a timing diagram depicting the operation of the interface of FIG. 16.

With reference to FIG. 17, a timing diagram 1700 is depicted that illustrates the relaxation of the timing requirements provided by implementing the delay latches 1608. In this embodiment D0 and D1 are sampled by Phi_0 and Phi_1 in one 1 GHz clock cycle, while D2 is sampled by Phi_2 in a next 1 GHz clock cycle. Sampling D0 and D1 in one 1 GHz clock cycle avoids the set-up time issues. Moreover, sampling D2 in a next 1 GHz clock cycle avoids the hold time issues. Thus, using a delayed sampling technique relaxes the time constraints on the interface between the DDFS cores and the synchronization circuit which can provide significant power savings. It should be appreciated that similar techniques can be applied for a different number of parallel DDFS cores. In general, the additional power consumed by the extra latches implemented in a delayed data path is small, as compared to the power savings provided by relaxing the sampling time constraints.

The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A receiver, comprising:
   a mixing digital-to-analog converter (DAC), comprising:
      a radio frequency (RF) transconductance section having an input for receiving an RF signal and an output for providing an RF current signal; and
      a switching section coupled to the RF transconductance section, the switching section having inputs for receiving bits associated with a digital local oscillator (LO) signal and having an output configured to provide an analog output signal, and wherein a DAC of the mixing DAC is implemented as a segmented DAC having a thermometer encoded DAC section and a binary encoded DAC section;
   a direct digital frequency synthesizer (DDFS) having outputs configured to provide the bits associated with the digital LO signal to the inputs of the switching section; and a dynamic element matching (DEM) circuit coupled between the outputs of the DDFS and the inputs of the switching section that are associated with the thermometer encoded DAC section, wherein the DEM circuit is configured to scramble the bits provided to the thermometer encoded DAC section.

2. The receiver of claim 1, further comprising:
a delay block coupled between the outputs of the DDFS and the inputs of the switching section that are associated with the binary encoded DAC section, wherein the delay block is configured for delaying the bits provided to the binary encoded DAC section an amount substantially equal to a delay introduced by scrambling the bits provided to the thermometer encoded DAC section.

3. The receiver of claim 1, further comprising:
a low noise amplifier (LNA) including an input and an output; and
a selectable filter coupled between the output of the LNA and the input of the RF transconductance section of the mixing DAC, wherein the selectable filter is selectable between a high-pass (HP) filter, a low-pass (LP) filter and an all-pass (AP) filter based on a selected channel.

4. The receiver of claim 1, wherein the mixing DAC further comprises:
a DC current source positioned to substantially direct bias currents from flowing through a load coupled to the output of the switching section.

5. The receiver of claim 1, wherein the mixing DAC further comprises:
a cascode transconductance section coupled between a load and the output of the switching section.

6. The receiver of claim 1, wherein the mixing DAC includes quadrature mixing DACs for, respectively, providing an in-phase (I) output signal and a quadrature (Q) output signal, and wherein the quadrature mixing DACs each have a telescopic circuit configuration.

7. The receiver of claim 1, wherein the mixing DAC includes quadrature mixing DACs for, respectively, providing an in-phase (I) output signal and a quadrature (Q) output signal, and wherein the quadrature mixing DACs have a folded circuit configuration.

8. The receiver of claim 1, wherein the mixing DAC includes quadrature mixing DACs for, respectively, providing an in-phase (I) output signal and a quadrature (Q) output signal, and wherein the quadrature mixing DACs are arranged in an RF transconductance DAC configuration.

9. The receiver of claim 1, wherein the RF transconductance section incorporates resistive degeneration to reduce flicker noise.

10. A receiver, comprising:
a mixing digital-to-analog converter (DAC), comprising:
a radio frequency (RF) transconductance section having an input for receiving an RF signal and an output configured to provide an RF current signal;
a switching section coupled to the RF transconductance section, the switching section having inputs for receiving bits associated with a digital local oscillator (LO) signal and having an output configured to provide an analog output signal; and
a DC current source configured to substantially direct bias currents from flowing through a load coupled to the output of the switching section; and
a direct digital frequency synthesizer (DDFS) having outputs configured to provide the bits associated with the digital LO signal to the inputs of the switching section.

11. The receiver of claim 10, further comprising:
a low noise amplifier (LNA) including an input and an output; and
a selectable filter coupled between the output of the LNA and the input of the RF transconductance section of the mixing DAC, wherein the selectable filter is selectable between a high-pass (HP) filter, a low-pass (LP) filter and an all-pass (AP) filter based upon a selected channel.

12. The receiver of claim 10, wherein the mixing DAC further comprises:
a cascode transconductance section coupled between the load and the output of the switching section.

13. The receiver of claim 10, wherein the RF transconductance section incorporates resistive degeneration to reduce flicker noise.

14. A receiver, comprising:
a mixing digital-to-analog converter (DAC), comprising:
a radio frequency (RF) transconductance section having an input for receiving an RF signal and an output for providing an RF current signal;
a switching section coupled to the RF transconductance section, the switching section having inputs for receiving bits associated with a digital local oscillator (LO) signal and having an output configured to provide an analog output signal; and
a transconductance boosting section coupled between a load and the output of the switching section; and
a direct digital frequency synthesizer (DDFS) having outputs configured to provide the bits associated with the digital LO signal to the inputs of the switching section.

15. The receiver of claim 14, further comprising:
a low noise amplifier (LNA) including an input and an output; and
a selectable filter coupled between the output of the LNA and the input of the RF transconductance section of the mixing DAC, wherein the selectable filter is selectable between a high-pass (HP) filter, a low-pass (LP) filter and an all-pass (AP) filter based upon a selected channel.

16. The receiver of claim 14, wherein the mixing DAC further comprises:
a DC current source positioned to substantially direct bias currents from flowing through the load.

17. The receiver of claim 14, wherein the mixing DAC includes quadrature mixing DACs for, respectively, providing an in-phase (I) output signal and a quadrature (Q) output signal, and wherein the quadrature mixing DACs are arranged in a telescopic circuit configuration.

18. The receiver of claim 14, wherein the mixing DAC includes quadrature mixing DACs for, respectively, providing an in-phase (I) output signal and a quadrature (Q) output signal, and wherein the quadrature mixing DACs are arranged in an RF transconductance DAC configuration.

19. The receiver of claim 14, wherein the RF transconductance section incorporates resistive degeneration to reduce flicker noise.

20. The receiver of claim 14, wherein the transconductance boosting section further comprises:
a cascode transconductance section having a cascode transistor including a first terminal, a second terminal and a control terminal, wherein the first terminal of the cascode transistor is coupled to the load and the second terminal of the cascode transistor is coupled to the output of the switching section; and an operational amplifier including a non-inverting input coupled to the output of the switching section, an inverting input for coupling to a voltage source and an output coupled to the control terminal of the cascode transistor, wherein the operational amplifier is configured to boost a gain of the cascode transistor.

* * * * *